US009081058B2

(12) United States Patent
Yonetoku et al.

(10) Patent No.: US 9,081,058 B2
(45) Date of Patent: Jul. 14, 2015

(54) SCAN TEST CIRCUIT, TEST PATTERN GENERATION CONTROL CIRCUIT, AND SCAN TEST CONTROL METHOD

(71) Applicant: Renesas Electronics Corporation, Kawasaki-shi (JP)

(72) Inventors: Hirofumi Yonetoku, Yokohama (JP); Norihiro Yamada, Yokohama (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 148 days.

(21) Appl. No.: 13/842,370

(22) Filed: Mar. 15, 2013

(65) Prior Publication Data

US 2013/0254609 A1    Sep. 26, 2013

(30) Foreign Application Priority Data

Mar. 22, 2012  (JP) ................................. 2012-065077
Oct. 9, 2012   (JP) ................................. 2012-223947

(51) Int. Cl.
*G01R 31/28*    (2006.01)
*G01R 31/3177*  (2006.01)
*G01R 31/3185*  (2006.01)

(52) U.S. Cl.
CPC ...... *G01R 31/3177* (2013.01); *G01R 31/31858* (2013.01); *G01R 31/318541* (2013.01); *G01R 31/318552* (2013.01)

(58) Field of Classification Search
CPC .................................................... G01R 31/3177
USPC .......................................... 714/726, 728, 731
See application file for complete search history.

(56) References Cited

U.S. PATENT DOCUMENTS

| 7,131,081 | B2 * | 10/2006 | Wang et al. ................ 716/136 |
| 7,266,743 | B2 * | 9/2007  | Athavale et al. ........... 714/727 |
| 7,313,743 | B2 * | 12/2007 | Wang et al. ................ 714/726 |
| 7,461,307 | B2 * | 12/2008 | Gunda et al. .............. 714/726 |
| 7,721,170 | B2 * | 5/2010  | Grise et al. ................ 714/726 |
| 7,779,375 | B2 * | 8/2010  | Grise et al. ................ 716/122 |
| 7,840,861 | B2 * | 11/2010 | Sul ........................... 714/726 |
| 8,578,226 | B2 * | 11/2013 | Chung ....................... 714/731 |
| 2008/0091998 | A1 | 4/2008 | Wang |

FOREIGN PATENT DOCUMENTS

JP       2008-096440 A    4/2008

* cited by examiner

*Primary Examiner* — Esaw Abraham
(74) *Attorney, Agent, or Firm* — McGinn IP Law Group, PLLC

(57) ABSTRACT

To improve a delay fault coverage without increasing an area overhead, provided is a scan test circuit including: scan flip-flops forming a clock domain that operates according to the same clock within a semiconductor integrated circuit including a target of a delay fault test; a test pattern generation mode control unit (scan flip-flop) that is supplied with the same clock as that supplied to the scan flip-flops, and selects one of a skewed-load mode and a broadside mode as a test pattern generation mode of the delay fault test; and a scan enable signal output unit (OR gate) that outputs a first scan enable signal, which is determined based on the test pattern generation mode, to the scan flip-flops.

34 Claims, 22 Drawing Sheets

SCAN TEST CIRCUIT, TEST PATTERN GENERATION CONTROL CIRCUIT, AND SCAN TEST CONTROL METHOD

CROSS-REFERENCE TO RELATED APPLICATIONS

This application is based upon and claims the benefit of priority from Japanese patent application No. 2012-065077, filed on Mar. 22, 2012 and No. 2012-223947, filed on Oct. 9, 2012, the disclosure of which is incorporated herein in its entirety by reference.

BACKGROUND

The present invention relates to a scan test circuit which can be suitably used as a scan test circuit that executes a delay fault test, for example.

In recent years, there is a tendency toward a reduction in the area and cost of semiconductor integrated circuits. To reduce the test time and percent defective which affect the cost, almost all types of semiconductor integrated circuits have been subjected to a scan test for a delay fault. Modes for generating a test pattern for use in a scan test for a delay fault (hereinafter referred to as "delay fault test pattern") include a broadside mode and a skewed-load mode. The delay fault test pattern is generally generated using the broadside mode in terms of ease of design. However, the broadside mode has a problem that the number of test patterns is relatively increased as compared with the skewed-load mode, and it is difficult to increase a delay fault coverage. For this reason, there is an increasing demand for reducing the number of delay fault test patterns and improving the test quality to reduce the test cost, by generating a delay fault test pattern using the skewed-load mode, though there are many restrictions in design in the skewed-load mode.

Japanese Unexamined Patent Application Publication No. 2008-096440 discloses a configuration in which one or more normal scan FFs are replaced with extended scan FFs in a scan chain including a plurality of normal scan FFs. Japanese Unexamined Patent Application Publication No. 2008-096440 also discloses a technique in which extended scan FFs are controlled in the skewed-load mode and normal scan FFs are controlled in the broadside mode. Assume herein that a component area occupied by the extended scan FFs is larger than a component area occupied by the normal scan FFs.

SUMMARY

In the configuration disclosed in Japanese Unexamined Patent Application Publication No. 2008-096440, it is necessary to increase the number of normal scan FFs to be replaced with extended scan FFs so as to fully obtain the effects of improving the delay fault coverage and reducing the number of delay fault test patterns. Accordingly, the configuration disclosed in Japanese Unexamined Patent Application Publication No. 2008-096440 has a problem that if the effects of reducing the number of delay fault test patterns and improving the delay fault coverage are fully obtained, an area overhead (hereinafter, referred to as "area OH") is increased. Other problems and new features become evident from the description of the specification and the accompanying drawings.

According to an aspect of the present invention, a delay fault test pattern generation control circuit includes: a test pattern generation mode control unit that is supplied with a clock identical with the clock supplied to a clock domain (logic circuit) to be controlled, and selects one of a skewed-load mode and a broadside mode as a test pattern generation mode; and a scan enable signal output unit that outputs a scan enable signal, which is determined based on the test pattern generation mode, to the clock domain (logic circuit).

According to the above-mentioned aspect of the present invention, it is possible to improve the delay fault coverage without increasing the area overhead.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION (First Embodiment)

Figure 1A:
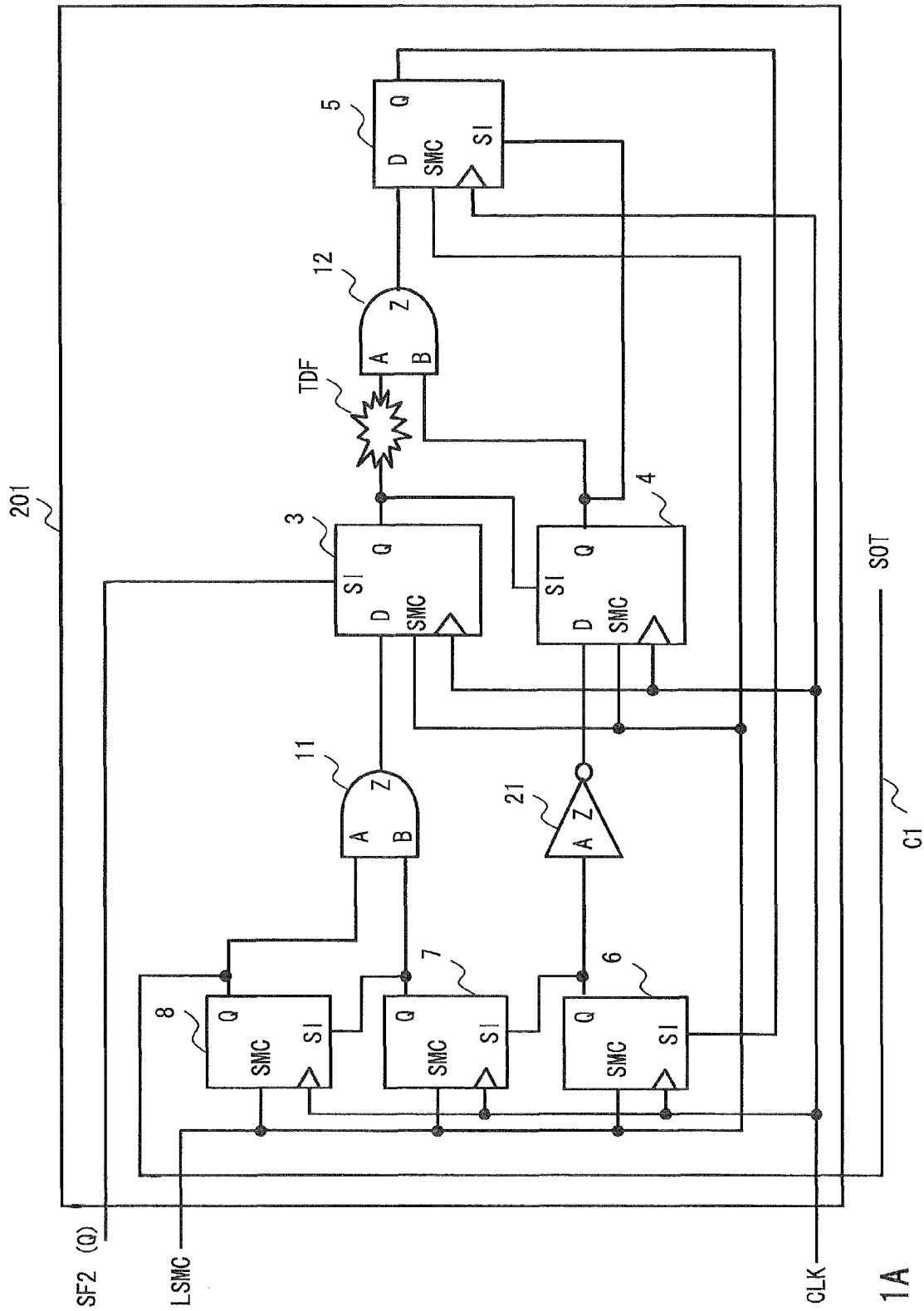
FIG. 1A is a block diagram of a logic circuit according to a first embodiment.
Figure 1B:
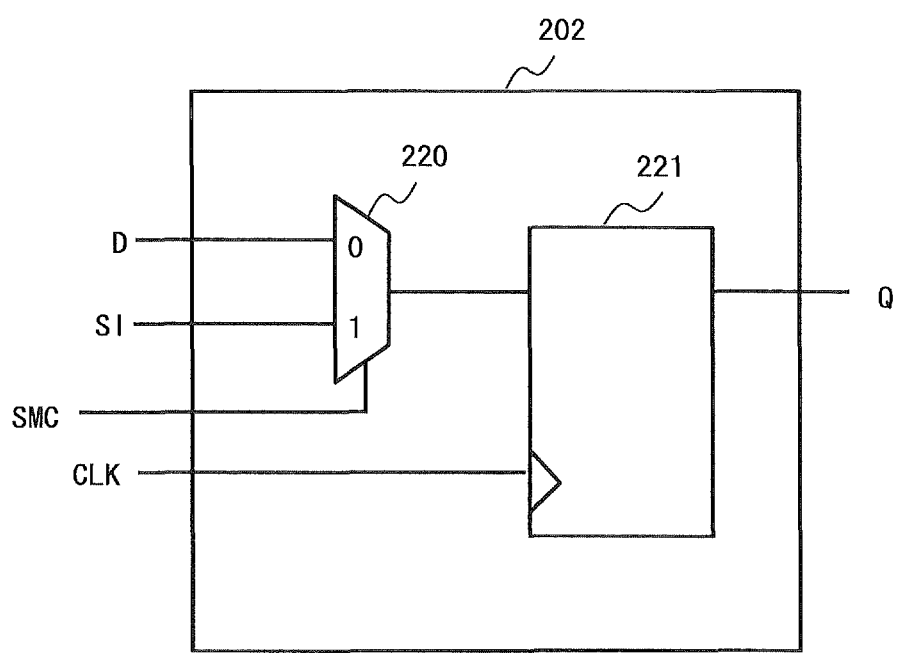
FIG. 1B is a block diagram of a multiplexer-type scan flip-flop according to the first embodiment.
Figure 1C:
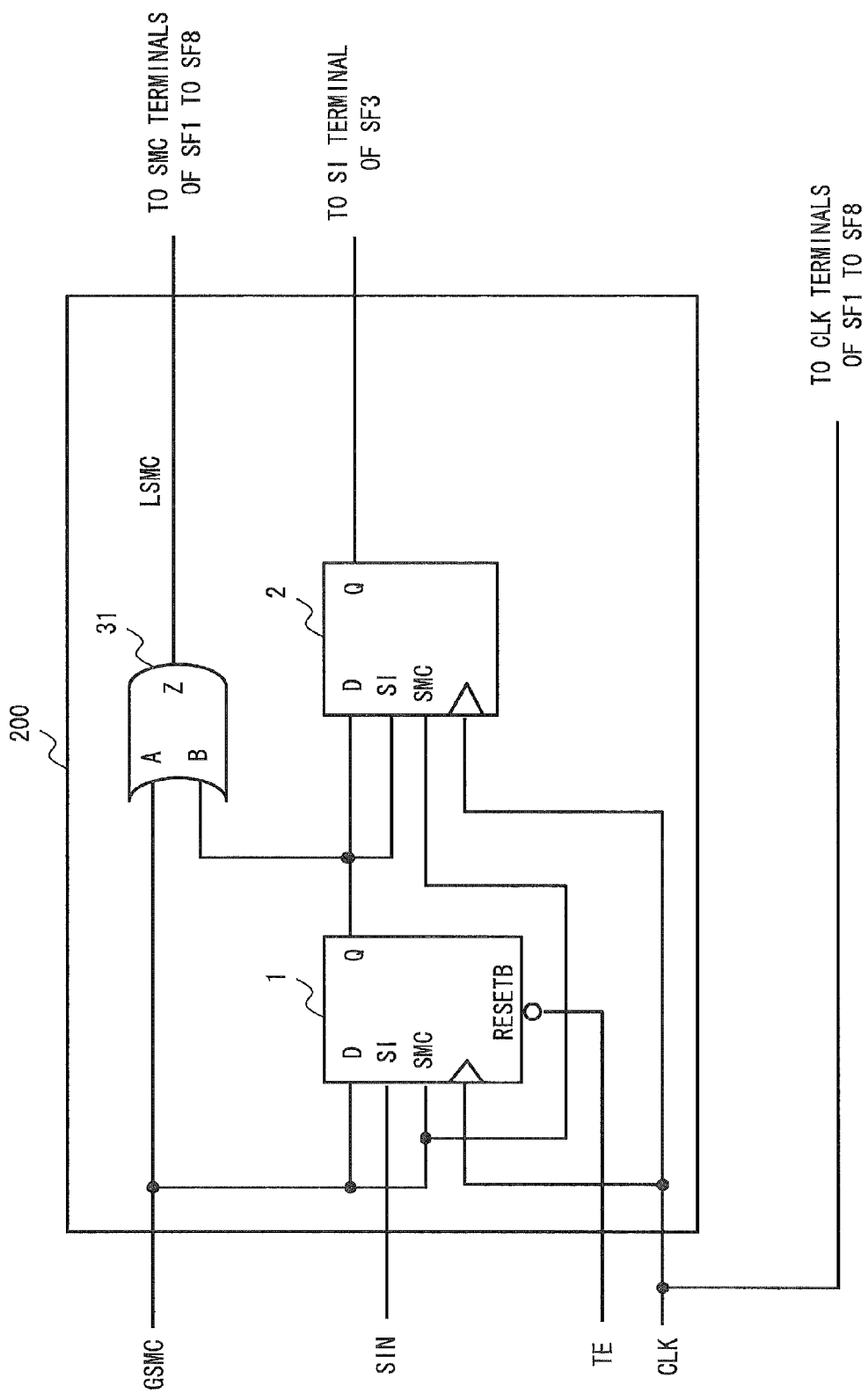
FIG. 1C is a block diagram of a delay fault test pattern generation control circuit according to the first embodiment.

Embodiments of the present invention will be described below with reference to the drawings. Referring to FIGS. 1A, 1B, and 1C, a configuration example of a scan test circuit including a delay fault test pattern generation control circuit 200 and a logic circuit 201 will be described. The logic circuit 201 is controlled using the delay fault test pattern generation control circuit 200.

The logic circuit 201 includes scan FFs (SF 3, SF 4, SF 5, SF 6, SF 7, and SF 8) forming a scan chain (C1); an AND gate (AND) 11, an AND 12, and an inverter (INV) 21, each of which is a combinational circuit for connecting the SFs; and a transition delay fault (TDF) that is defined at a data input terminal A of the AND 12.

A scan-in terminal (SI) and a data output terminal (Q) of each SF of the logic circuit 201 are connected as follows in the order of the configuration of the scan chain (C1). That is, for example, the scan-in terminal (SI) of the SF 3-the data output terminal (Q) of the SF 3-the scan-in terminal (SI) of the SF 4-the data output terminal (Q) of the SF 4-the scan-in terminal (SI) of the SF 5-the data output terminal (Q) of the SF 5-the scan-in terminal (SI) of the SF 6-the data output terminal (Q) of the SF 6-the scan-in terminal (SI) of the SF 7-the data output terminal (Q) of the SF 7-the scan-in terminal (SI) of the SF 8-the data output terminal (Q) of the SF 8-a scan-out signal (SOT) for scan chain.

A clock terminal (CLK) of each SF of the logic circuit 201 is connected to a signal line for an external clock signal (CLK). A scan enable terminal (SMC) of each SF of the logic circuit 201 is connected to a local scan enable terminal (LSMC) of the delay fault test pattern generation control circuit 200.

A data input terminal (A) of the AND 11 is connected to the data output terminal (Q) of the SF 8. A data input terminal (B) of the AND 11 is connected to the data output terminal (Q) of the SF 7. A data output terminal (Z) of the AND 11 is connected to a data input terminal (D) of the SF 3.

The data input terminal (A) of the AND 12 is connected to the data output terminal (Q) of the SF 3. The data input terminal (B) of the AND 12 is connected to the data output terminal (Q) of the SF 4. The data output terminal (Z) of the AND 12 is connected to the data input terminal (D) of the SF 5.

The data input terminal (A) of the INV 21 is connected to the data output terminal (Q) of the SF 6. The data output terminal (Z) of the INV 21 is connected to the data input terminal (D) of the SF 4.

Each SF may be a multiplexer-type scan FF, for example. A configuration example of the multiplexer-type scan FF will now be described with reference to FIG. 1B. A multiplexer-type SF 202 includes a multiplexer (MUX) 220 and a D-FF (DFF) 221. A "0" input terminal of the MUX 220 is connected to the data input terminal (D) of the multiplexer-type SF 202. A "1" input terminal of the MUX 220 is connected to the scan-in terminal (SI) of the multiplexer-type SF 202. A select terminal of the MUX 220 is connected to the scan enable terminal (SMC) of the multiplexer-type SF 202. An output terminal of the MUX 220 is connected to the data input terminal of the DFF 221. A clock terminal of the DFF 221 is connected to the clock terminal (CLK) of the multiplexer-type SF 202. The data output terminal of the DFF 221 is connected to the data output terminal (Q) of the multiplexer-type SF 202.

Next, the configuration of the delay fault test pattern generation control circuit 200 will be described with reference to FIG. 1C. The delay fault test pattern generation control circuit 200 includes an SF 1, an SF 2, and an OR gate (OR) 31. The SF 1 determines the local scan enable signal (LSMC) which is output to the six SFs of the logic circuit 201. In the case of generating a test pattern by use of ATPG, when "1" is set to the SF 1 as an initial value, a test pattern for a skewed-load mode is generated, and when "0" is set to the SF 1 as an initial value, a test pattern for a broadside mode is generated. The SF 1 corresponds to a test pattern generation mode control unit that selects one of the skewed-load mode and the broadside mode as a test pattern generation mode of a delay fault test.

The SF 2 is a scan FF that prevents an adverse effect of the control value of the SF 1 on the toggle signal value of the SF 3, which is connected to the head of the scan chain within the logic circuit unit, in the case of generating a skewed-load mode pattern. The toggle signal value of the SF 3 is a signal value for allowing the signal value output from the SF 3 to transit. When the test pattern generation mode is the skewed-load mode, the SF 2 corresponds to a toggle value control unit that performs a scan shift operation on the toggle value, which is set to allow the value held in the SF 3 to transit, and outputs the toggle value.

The functions of the SF 2 will be described in more detail. For example, a description is given of the case where a test pattern is generated using the skewed-load mode to check the transition from "1" to "0" in the TDF. In this case, it is necessary to set the initial value of the SF 1 to "1" so as to generate a test pattern using the skewed-load mode. It is also necessary to set the initial value of the SF 3 to "1" so as to allow the value to transit from "1" to "0" in the TDF. Next, it is necessary for the SF 3 to capture "0" at the next clock timing (launch clock application time) so as to allow the value to transit from "1" to "0" in the TDF. In this case, when the SF 2 is not present, the output value of the SF 1 is captured into the SF 3. That is, since "1" is set as the initial value to the SF 1 so as to generate the test pattern using the skewed-load mode, "1" is output at the next clock timing. In this case, the SF 3 captures "1", which makes it difficult for the SF 3 to check the transition from "1" to "0". For this reason, the SF 2 is provided and the initial value of the SF 2 is set to "0", thereby enabling the SF 3 to capture "0" at the next clock timing. Thus, the provision of the SF 2 prevents the value of the SF 1 from being directly output to the SF 3, which is the head of the scan chain within the logic circuit 201, when "1" is set to the SF 1 so as to generate the test pattern using the skewed-load mode.

The OR 31 is a gate for allowing a global scan enable signal (GSMC) or a signal output from the SF 1 to propagate as the local scan enable signal (LSMC) to be output to the six SFs during the scan shift operation. The OR 31 corresponds to a scan enable signal output unit that outputs the signal output from the SF 1, which is determined based on the test pattern generation mode, to the SF 3 to SF 8.

The delay fault test pattern generation control circuit 200 receives the global scan enable signal (GSMC), a scan-in signal (SIN) of the scan chain, and a scan test mode signal (TE). The global scan enable signal (GSMC) indicates the signal value "1" during the scan shift operation, and indicates the signal value "0" in the cases other than the scan shift operation. The scan test mode signal (TE) indicates the signal value "1" during a scan test, and indicates the signal value "0" in the cases other than the scan test. Further, the delay fault test pattern generation control circuit 200 outputs the local scan enable signal (LSMC) to the logic circuit (201).

The data input terminal (D) and the scan enable terminal (SMC) of the SF 1 of the delay fault test pattern generation control circuit 200 are connected to the signal line of the global scan enable signal (GSMC). The scan-in terminal (SI) of the SF 1 is connected to the scan chain through which the scan-in signal (SIN) propagates. The clock terminal (CLK) of the SF 1 is connected to the signal line of the external clock signal (CLK). The data output terminal (Q) of the SF 1 is connected to the data input terminal (B) of the OR 31 and the data input terminal (D) and the scan-in terminal (SI) of the SF 2. A reset-bar terminal (RESETS) of the SF 1 is connected to the signal line of the external scan test mode signal (TE). The reset-bar terminal (RESETS) of the scan FF (SF 1) is connected to the signal line of the external scan test mode signal (TE) so that a user logic is prevented from being destroyed by resetting the SF 1 during a user mode. In other words, when the logic circuit 201 is used not for a scan test but for a normal operation, the reset-bar terminal (RESETS) is used to prevent the value set to the SF 1 from propagating to the logic circuit 201.

The scan enable terminal (SMC) of the SF 2 of the delay fault test pattern generation control circuit 200 is connected to the signal line of the global scan enable signal (GSMC). The clock terminal (CLK) of the SF 2 is connected to the signal line of the external clock signal (CLK). The data output terminal (Q) of the SF 2 is connected to the scan-in terminal (SI) of the SF 3 of the logic circuit 201.

Assume herein that the external clock signals (CLK) that are connected to the SF 1 and SF 2 of the delay fault test pattern generation control circuit 200 and to the SF 3 to SF 8 of the logic circuit 201 are the same. That is, the SF 1 to the SF 8 belong to the same clock domain. In other words, the delay fault test pattern generation control circuit 200 may control the transition of signals in the scan FFs belonging to the same clock domain. As a result, the SF 1 to the SF 8 are controlled using the same external clock signal (CLK), thereby facilitating control of the transition of signals such as the local scan enable signal (LSMC), for example. Since the SF 1 to the SF 8 belong to the same clock domain, the transition of the local scan enable signal (LSMC) between a launch clock and a capture clock of each of the SF 1 to the SF 8 can be easily controlled, for example. Such a signal transition control may also be referred to as "at-speed control".

The data input terminal (A) of the OR 31 of the delay fault test pattern generation control circuit 200 is connected to the signal line of the global scan enable signal (GSMC). The data input terminal (B) of the OR 31 is connected to the data output terminal (Q) of the SF 1. The data output terminal (Z) of the OR 31 is connected to the signal line of the local scan enable signal (LSMC).

Figure 2:
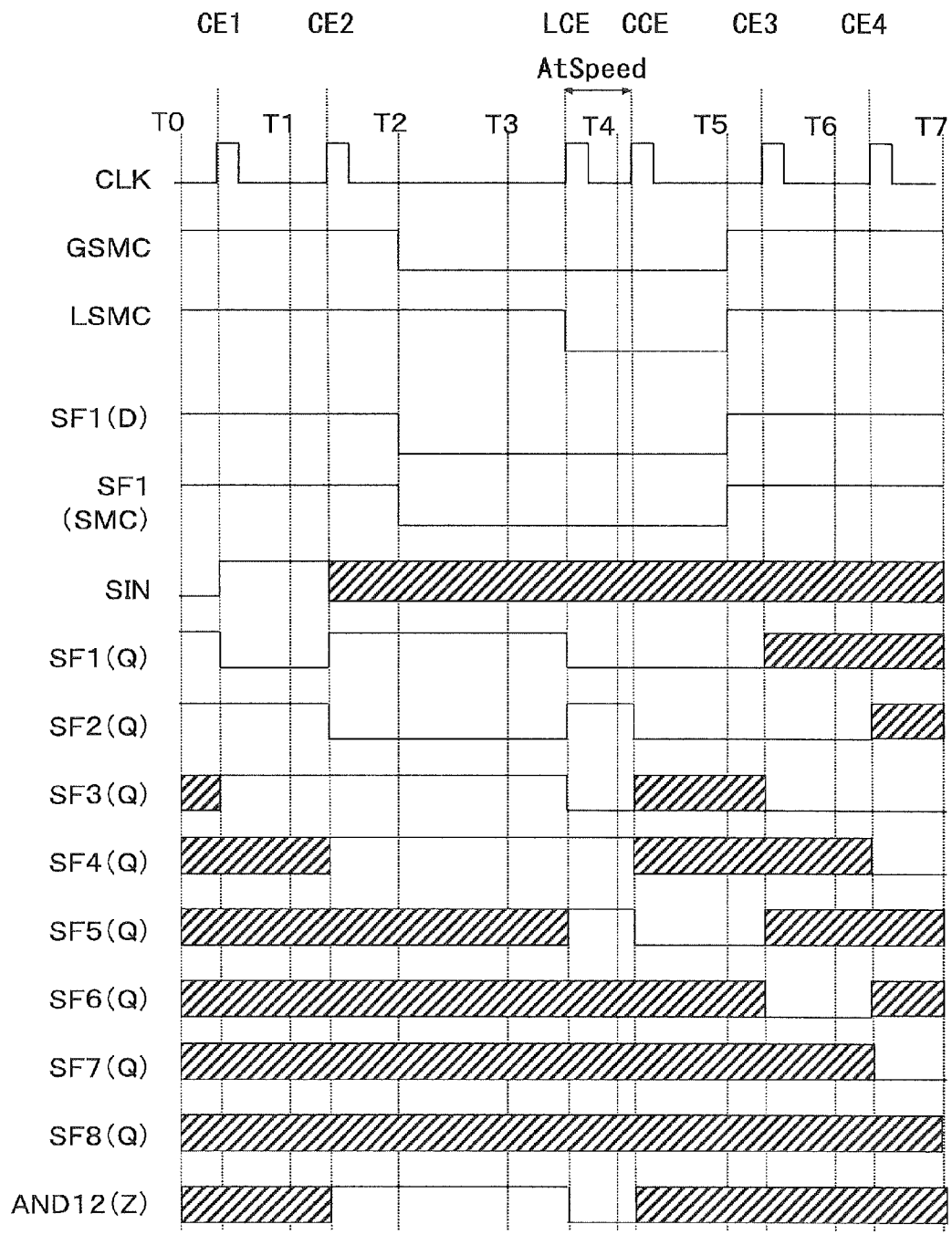
FIG. 2 is a timing diagram for generating a skewed-load mode test pattern according to the first embodiment.

Referring next to FIG. 2, a description is given of a timing diagram illustrating that a test pattern is generated by setting the SF 1 of the delay fault test pattern generation control circuit 200 to the signal value "1" immediately before a launch clock application time (LCE), i.e., a skewed-load mode test pattern is generated. Setting of the SF 1 to the signal value "1" immediately before the LCE indicates that the SF 1 outputs the signal value "1" immediately before the LCE.

As for a fault to be detected, assume herein that the transition delay fault (TDF) shown in FIG. 1A is an STF (Slow To Fall) fault (hereinafter, "target fault F1"). Note that each signal that does not directly affect the detection of the target fault F1 is represented by oblique lines in FIG. 2, and is herein represented as an X value. The X value is an indefinite value that can take "0" or "1". The signal value of the data input terminal (D) of the SF 1 is the same as the signal value of the global scan enable signal (GSMC), so the description thereof is omitted.

To detect the target fault F1, it is necessary to set the signal value of the data output terminal (Q) of the SF 2 to "0", set the signal value of the data output terminal (Q) of the SF 3 to "1", and set the signal value of the data output terminal (Q) of the SF 4 to "1", immediately before the launch clock application time (LCE). It is also necessary to set the signal value of the data output terminal (Q) of the SF 3 to "0" and set the signal value of the data output terminal (Q) of the SF 4 to "1", immediately before a capture clock application time (CCE). That is, it is necessary to set the above-mentioned signal values so as to allow the value of the data output terminal (Q) of the SF 3 to transit from "1" to "0" before and after the application of the launch clock. Hereinafter, the circuit operation for detecting the target fault F1 will be described in chronological order.

A period from time (T0) to time (T2) and a period from time (T5) to time (T7) corresponds to a scan shift cycle in which the global scan enable signal (GSMC) is set to "1". That is, during the period from time (T0) to time (T2), the value of the test pattern generated using the ATPG is set to each of the SF 1 to the SF 7 by use of the scan chain. A period from time (T2) to time (T3) corresponds to an external input signal supply cycle in which the GSMC is set to "0". A period from time (T3) to time (T4) corresponds to a launch clock cycle in which the launch clock is applied. A period from time (T4) to time (T5) corresponds to a capture clock cycle in which the capture clock is applied.

At time (T0), the scan-in signal (SIN), the status values of the SFs, and the signal value of the AND 12 are set as follows.

$(SIN, SF1(Q), SF2(Q), SF3(Q), SF4(Q), SF5(Q), SF6(Q),$
$SF7(Q), SF8(Q), AND12(Z)) = (0,1,1,X,X,X,X,X,X,X)$

At time (CE1), the scan-in signal (SIN), the status values of the SFs, and the signal value of the AND 12 at time (T1) after the application of the scan shift clock signal (CLK) are set as follows.

$(SIN, SF1(Q), SF2(Q), SF3(Q), SF4(Q), SF5(Q), SF6(Q),$
$SF7(Q), SF8(Q), AND12(Z)) = (1,0,1,1,X,X,X,X,X,X)$

At time (T2), the global scan enable signal (GSMC) transits from the signal value "1" to the signal value "0". At time (T2) and time (T3) after the application of the scan shift clock signal (CLK) at time (CE2), the scan-in signal (SIN), the status values of the SFs, and the signal value of the AND 12 are set as follow.

$(SIN, SF1(Q), SF2(Q), SF3(Q), SF4(Q), SF5(Q), SF6(Q),$
$SF7(Q), SF8(Q), AND12(Z)) = (X,1,0,1,1,X,X,X,X,1)$

At time (LCE), the scan-in signal (SIN), the status values of the SFs, and the signal value of the AND 12 at time (T4) after the application of the launch clock are set as follows.

$(SIN, SF1(Q), SF2(Q), SF3(Q), SF4(Q), SF5(Q), SF6(Q),$
$SF7(Q), SF8(Q), AND12(Z)) = (X,0,1,0,1,1,X,X,X,0)$

At time (CCE), the scan-in signal (SIN), the status values of the SFs, and the signal value of the AND 12 at time (T5) after the application of the capture clock are set as follows.

$(SIN, SF1(Q), SF2(Q), SF3(Q), SF4(Q), SF5(Q), SF6(Q),$
$SF7(Q), SF8(Q), AND12(Z)) = (X,0,0,X,X,0,X,X,X,X)$

FIG. 2 shows a time chart during the normal operation in which the delay fault (STF) of the target fault F1 does not occur. When the delay fault (STF) of the target fault F1 is present, the signal captured into the SF 5 at the time of application of the capture clock at time (CCE) indicates the signal value "1" of the AND 12 prior to the transition of the SF 3. In this case, the scan-in signal (SIN), the status values of the SFs, and the signal value of the AND 12 are set as follows.

(SIN,SF1(Q),SF2(Q),SF3(Q),SF4(Q),SF5(Q),SF6(Q), SF7(Q),SF8(Q),AND12(Z))=(X,0,0,X,X,1,X,X,X, X)

In the scan shift operation after time (T5), the signal value of the SF 5, which is captured at the capture cycle, is observed using the scan-out terminal (SOT) of the scan chain (C1). In this case, when the output value of the SF 5 is "1", it can be determined that the delay fault (STF) has occurred.

Figure 3:
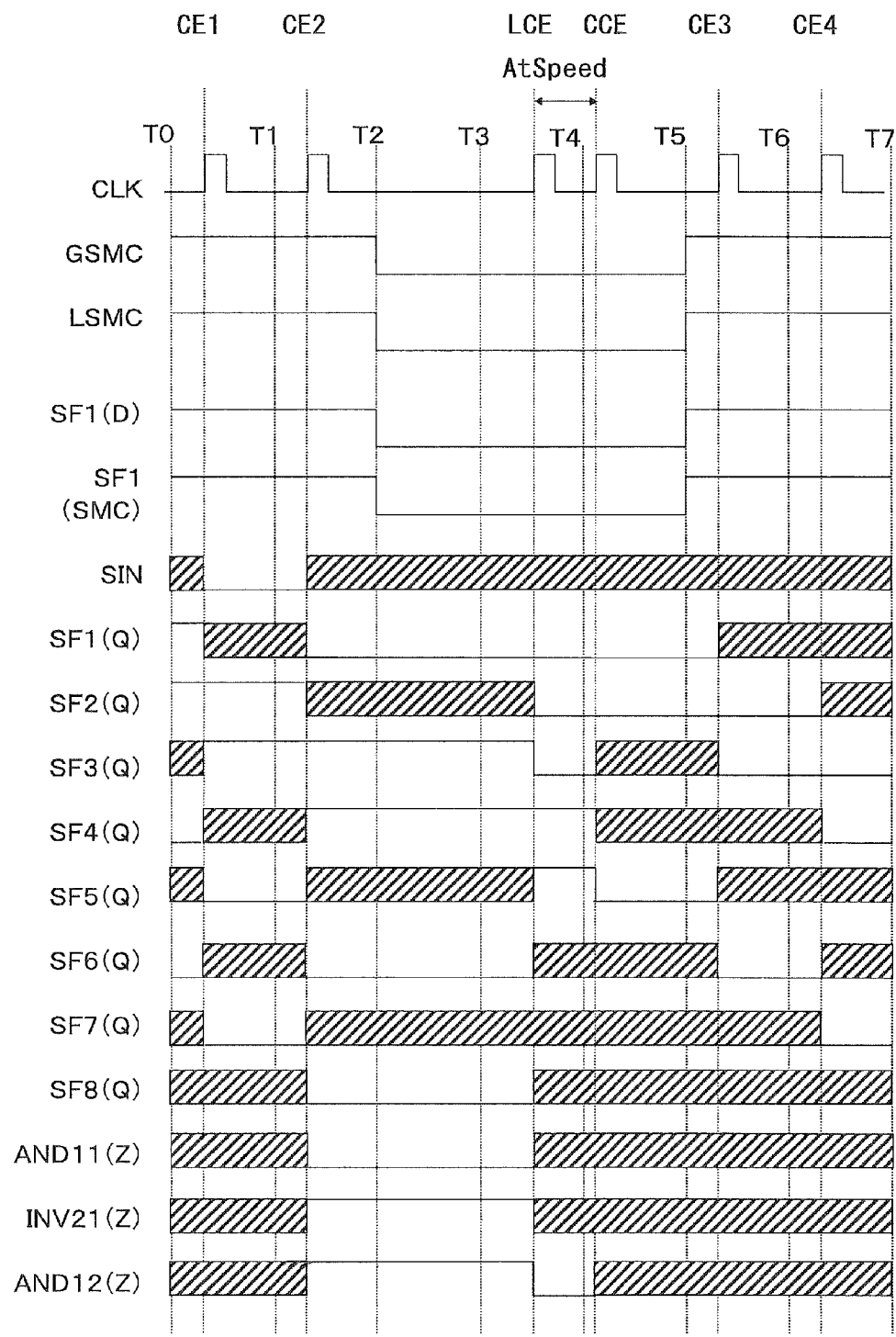
FIG. 3 is a timing diagram for generating a broadside mode test pattern according to the first embodiment.

Referring next to FIG. 3, a description is given of a timing diagram illustrating that a test pattern is generated by setting the SF 1 of the delay fault test pattern generation control circuit 200 to the signal value "0" immediately before the launch clock application time (LCE), i.e., a broadside mode test pattern is generated.

As for a fault to be detected, assume herein that the transition delay fault (TDF) shown in FIG. 1A is an STF (Slow To Fall) fault (hereinafter, "target fault F2"). Note that each signal that does not directly affect the detection of the target fault F2 is represented by oblique lines in FIG. 3, and is herein represented as an X value. The signal value of the data input terminal (D) of the SF 1 is the same as the signal value of the global scan enable signal (GSMC), so the description thereof is omitted.

To detect the target fault F2, it is necessary to set the signal value of the data output terminal (Q) of the SF 6 to "0", set the signal value of the data output terminal (Q) of the SF 7 or the data output terminal (Q) of the SF 8 to "0", set the signal value of the data output terminal (Q) of the SF 3 to "1", and set the signal value of the data output terminal (Q) of the SF 4 to "1", immediately before the launch clock application time (LCE). It is also necessary to set the signal value of the data output terminal (Q) of the SF 3 to "0" and set the signal value of the data output terminal (Q) of the SF 4 to "1", immediately before the capture clock application time (CCE). That is, it is necessary to set the above-mentioned signal values so as to allow the value of the data output terminal (Q) of the SF 3 to transit from "1" to "0" before and after the application of the launch clock. Hereinafter, the circuit operation for detecting the target fault F2 will be described in chronological order.

For convenience of explanation, assume herein that the signal value of the data output signal (Q) of the SF 8 is "0" and the signal value of the data output terminal (Q) of the SF 7 is "X" immediately before the launch clock application time (LCE).

The description of each cycle from time (T0) to time (T7) is the same as that in the case of generating the skewed-load mode test pattern, so the description thereof is omitted.

At time (T0), the scan-in signal (SIN), the status values of the SFs, and the signal values of the AND 11, AND 12, and INV 21 are set as follows.

(SIN,SF1(Q),SF2(Q),SF3(Q),SF4(Q),SF5(Q),SF6(Q), SF7(Q),SF8(Q),AND11(Z),INV21(Z),AND12 (Z))=(X,1,1,X,0,X,0,X,X,X,X)

At time (CE1), the scan-in signal (SIN), the status values of the SFs, and the signal values of the AND 11, AND 12, and INV 21 at time (T1) after the application of the scan shift clock signal (CLK) are set as follows.

(SIN,SF1(Q),SF2(Q),SF3(Q),SF4(Q),SF5(Q),SF6(Q), SF7(Q),SF8(Q),AND11(Z),INV21(Z),AND12 (Z))=(0,X,1,1,X,0,X,0,X,X,X)

At time (T2), the global scan enable signal (GSMC) transits from the signal value "1" to the signal value "0". At time (CE2), the scan-in signal (SIN), the status values of the SFs, and the signal values of the AND 11, AND 12, and INV 21 at time (T2) and time (T3) after the application of the scan shift clock signal (CLK) are set as follows.

(SIN,SF1(Q),SF2(Q),SF3(Q),SF4(Q),SF5(Q),SF6(Q), SF7(Q),SF8(Q),AND11(Z),INV21(Z),AND12 (Z))=(X,0,X,1,1,X,0,X,0,0,1,1)

At time (LCE), the scan-in signal (SIN), the status values of the SFs, and the signal values of the AND 11, AND 12, and INV 21 at time (T4) after the application of the launch clock are set as follows.

(SIN,SF1(Q),SF2(Q),SF3(Q),SF4(Q),SF5(Q),SF6(Q), SF7(Q),SF8(Q),AND11(Z),INV21(Z),AND12 (Z))=(X,0,0,0,1,1,X,X,X,X,X,0)

At time (CCE), the scan-in signal (SIN), the status values of the SFs, and the signal values of the AND 11, AND 12, INV 21 at time (T5) after the application of the capture clock are set as follows.

(SIN,SF1(Q),SF2(Q),SF3(Q),SF4(Q),SF5(Q),SF6(Q), SF7(Q),SF8(Q),AND11(Z),INV21(Z),AND12 (Z))=(X,0,0,X,X,0,X,X,X,X,X,X)

FIG. 3 shows a time chart during the normal operation in which the delay fault (STF) of the target fault F2 does not occur. When the delay fault (STF) of the target fault F2 is present, the signal captured into the SF 5 at the time of application of the capture clock at time (CCE) indicates the signal value "1" of the AND 12 prior to the transition of the SF 3. In this case, the scan-in signal (SIN), the status values of the SFs, and the signal values of the AND 11, AND 12, and INV 21 are set as follows.

(SIN,SF1(Q),SF2(Q),SF3(Q),SF4(Q),SF5(Q),SF6(Q), SF7(Q),SF8(Q),AND11(Z),INV21(Z),AND12 (Z))=(X,0,0,X,X,1,X,X,X,X,X,X)

In the scan shift operation after time (T5), the signal value of the SF 5, which is captured at the capture cycle, is observed using the scan-out terminal (SOT) of the scan chain (C1). In this case, when the output value of the SF 5 is "1", it can be determined that the delay fault (STF) has occurred in the transition delay fault (TDF).

As described above, the use of the SF 1 in the delay fault test pattern generation control circuit 200 according to the first embodiment enables execution of a test for the logic circuit 201 using the test patterns of the skewed-load mode and the broadside mode.

In the first embodiment, the delay fault test pattern generation control circuit 200 including one RESETS-equipped scan FF, one scan FF, and one OR gate is incorporated for each clock domain in the entire circuit. Accordingly, only the delay fault test pattern generation control circuits 200 corresponding to the number of clock domains occupy the area OH. In many cases, the number of clock domains is less than 100.

In the case of a circuit including one million FFs, the area OH of the first embodiment is (one RESETB-equipped scan FF+one scan FF+OR gate)×100, at maximum. The area OH of the configuration disclosed in Japanese Unexamined Patent Application Publication No. 2008-096440 is (normal FF+OR gate)×20000 (the number of FFs corresponding to 2% of the entire FFs). For comparison, consideration is given to the case where the area OH of the configuration according to the first embodiment and the area OH of the configuration disclosed in Japanese Unexamined Patent Application Publication No. 2008-096440 are converted into the number of transistors. Assuming that the reset-bar terminal RESETB-equipped scan FF corresponds to 40 Tr; the scan FF corresponds to 38 Tr; the normal FF corresponds to 28 Tr; and the OR gate corresponds to 6 Tr, the area OH of the first embodiment is represented by (40+38+6)×100=8400 Tr, and the area OH of the configuration disclosed in Japanese Unexamined Patent Application Publication No. 2008-096440 is represented by (28+6)×20000=680000 Tr. Thus, the area OH of the first embodiment is about 1/80 of that of the configuration disclosed in Japanese Unexamined Patent Application Publication No. 2008-096440. Accordingly, the configuration of the first embodiment provides an advantageous effect of drastically reducing the area OH as compared with the configuration disclosed in Japanese Unexamined Patent Application Publication No. 2008-096440.

In the first embodiment, the ATPG tool can continuously try to generate test patterns using the skewed-load mode and the broadside mode in a calculation process for one target fault. In other words, the execution of a test involving the skewed-load mode or the execution of a test involving the broadside mode can be selected depending on the initial value set to the SF 1 of the delay fault test pattern generation control circuit 200 and on the initial values set to other SFs so as to set a transition value which is necessary for testing the target fault. Accordingly, the initial value set to each SF is changed upon generation of the test pattern using the ATPG tool, thereby making it possible to generate test patterns including a test mode involving the skewed-load mode and a test mode involving the broadside mode.

In the case of generating a test pattern for a delay fault test in an arbitrary section, for example, if a test pattern in the skewed-load mode cannot be generated, a test pattern in the broadside mode can be generated by changing the value of each SF. As a result, the probability of generating a test pattern capable of detecting a target fault is increased, leading to an improvement in the delay fault coverage.

The case where the test pattern in the skewed-load mode cannot be generated will now be described. As for a fault to be detected, assuming that the transition delay fault (TDF) is an STR (Slow To Rize) fault in FIG. 1A, consideration is given to the operation when the STR fault is a detection target (hereinafter referred to as "target fault F3").

It is necessary to propagate the STR fault to the data output terminal (Z) of the AND 12 so as to detect the target fault F3. Accordingly, it is necessary to set, as the signal value of the data output terminal (Q) of the SF 3, a value that causes transition from the signal value "0" to the signal value "1" before and after the application of the launch clock. It is also necessary to set the signal value of the SF 4(Q) to "1" after the application of the launch clock.

When the ATPG tool sets the signal value of the data output signal (Q) of the SF 1 to "1" and generates a test pattern using the skewed-load mode, the signal to be captured into each SF upon application of the launch clock is captured from the scan-in terminal (SI). Thus, the signal value captured into the SF 4 that drives the data output terminal (B) of the AND 12 corresponds to the signal value of the data output signal (Q) of the SF 3 connected with the scan-in terminal (SI) of the SF 4. Since the signal value of the data output signal (Q) of the SF 3 before the application of the launch clock is "0", the signal value of the data output signal (Q) of the SF 4 after the application of the launch clock is "0". When the signal value of the data output signal (Q) of the scan FF (SF 4) after the application of the launch clock is "0", the data input terminal (B) of the AND 12 indicates the value "0", which makes it difficult to allow the STR fault of the target fault F3 to propagate to the data output terminal (Z) side of the AND 12. Accordingly, the ATPG tool determines that the STR fault of the target fault F3 cannot be detected based on the test pattern in the skewed-load mode.

Then, the ATPG tool sets the signal value of the data output terminal (Q) of the SF 1 to "0", and tries to generate the test pattern in the broadside mode. In this case, the signal to be captured into each SF upon application of the launch clock is captured from the data input terminal (D). The signal values to be captured into the data input terminals (D) of the SF 3 and the SF 4 can be determined using the SF 7, the SF 8, and the SF 6. The ATPG tool can set the signal values of (SF 3, SF 6, SF 7, and SF 8) respectively to (0, 0, 1, 1) before the application of the launch clock. Accordingly, the signal values of the data output terminals (Q) of the scan FFs (SF 3 and SF 4), which are respectively (0 and X) before the application of the launch clock, can be respectively set to (1 and 1) after the application of the launch clock. This allows the STR fault of the target fault F3 to propagate to the data output terminal (Z) of the AND 12. This enables the data input terminal (D) of the SF 5 to capture the STR fault of the target fault F3 and to detect the delay fault, which cannot be detected using the skewed-load mode, by using the broadside mode. In particular, a larger number of delay faults can be detected at the initial stage of the ATPG, which enables obtainment of a high delay fault coverage with a small number of test patterns.

(Second Embodiment)

Figure 4:
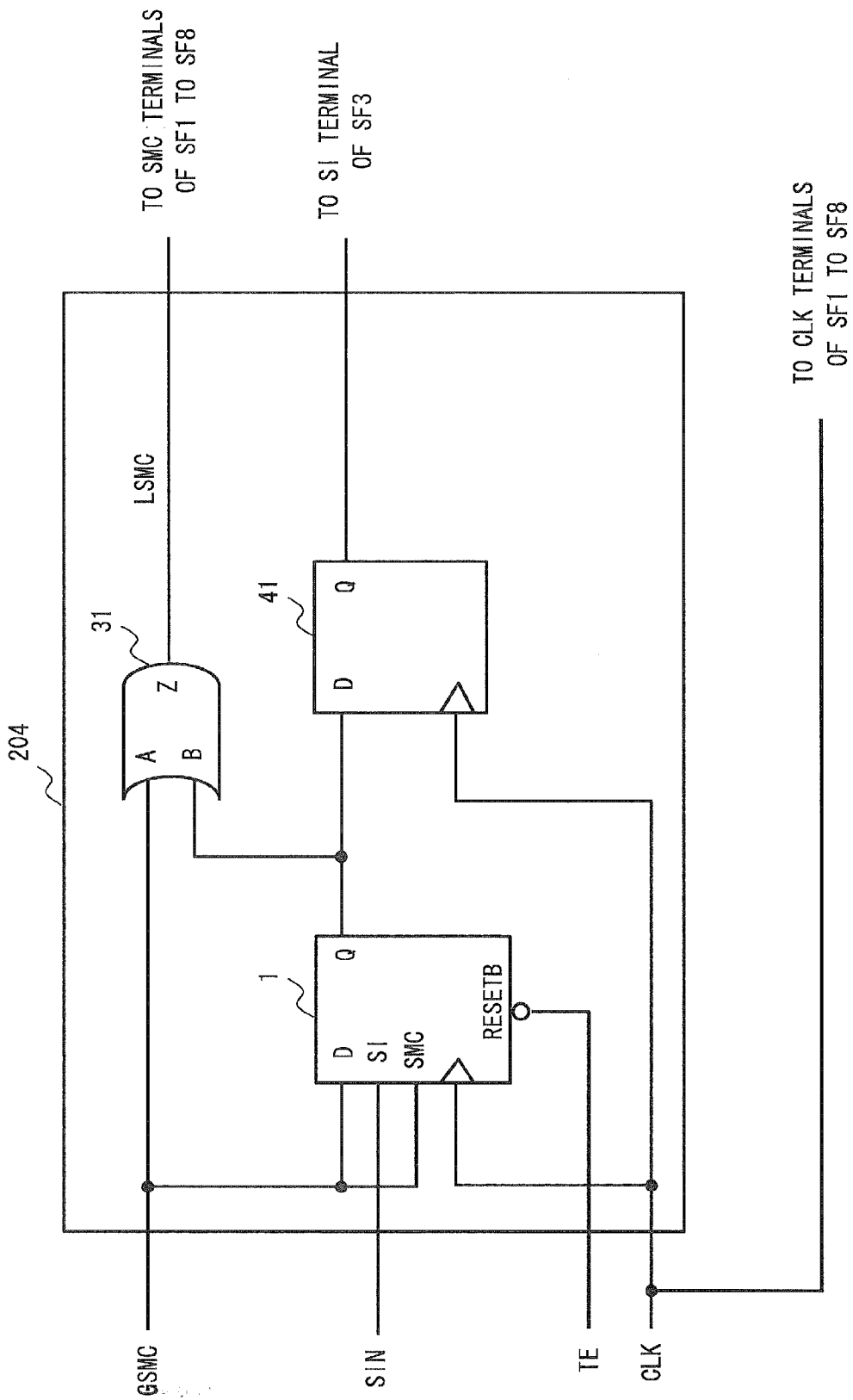
FIG. 4 is a block diagram of a delay fault test pattern generation control circuit according to a second embodiment.

Subsequently, a configuration example of a delay fault test pattern generation control circuit 204 according to a second embodiment will be described with reference to FIG. 4.

The delay fault test pattern generation control circuit 204 has a configuration in which one of the scan FFs, i.e., the SF 2, of the delay fault test pattern generation control circuit 200 is replaced with a normal FF (NF 41).

The data input terminal (D) of the NF 41 is connected to the data output terminal Q of the SF 1. The clock terminal (CLK) of the NF 41 is connected to the signal line of the external clock signal (CLK). The data output terminal (Q) of the NF 41 is connected to the scan chain (C1) of the logic circuit 201.

The other circuit configuration of the delay fault test pattern generation control circuit 204 is similar to that of the delay fault test pattern generation control circuit 200 shown in FIG. 1, so the description thereof is omitted. The circuit configuration of the logic circuit 201 and the circuit configuration of the multiplexer-type scan FF 202 are the same as those shown in FIG. 1, so the description thereof is omitted.

The delay fault test pattern generation control circuit 204 operates in the same manner as in the timing diagram shown in FIGS. 2 and 3, so the detailed description of the operation is omitted.

In the second embodiment, the delay fault test pattern generation control circuit 204 including one RESETB-equipped scan FF, one normal FF, and one OR gate is incorporated for each clock domain in the entire circuit. Accordingly, only the delay fault test pattern generation control circuits 204 corresponding to the number of clock domains occupy the area OH.

Also in the second embodiment, the delay fault test pattern generation control circuit 204 is converted into the number of transistors under the same conditions as those of the first embodiment. When 100 delay fault test pattern generation control circuits 204 are incorporated, the area OH is represented by (reset-bar terminal RESETB-equipped scan FF+normal FF+OR gate)×100=(40+28+6)×100=7400 Tr. The area OH of the configuration disclosed in Japanese Unexamined Patent Application Publication No. 2008-096440 is represented by (28+6)×20000=680000 Tr. The area OH of the second embodiment is about 1/90 of the area OH of the configuration disclosed in Japanese Unexamined Patent Application Publication No. 2008-096440. Accordingly, the second embodiment provides an advantageous effect of reducing the area OH. The second embodiment also provides an advantageous effect of further reducing the area OH as compared with the first embodiment.

(Third Embodiment)

Figure 5A:
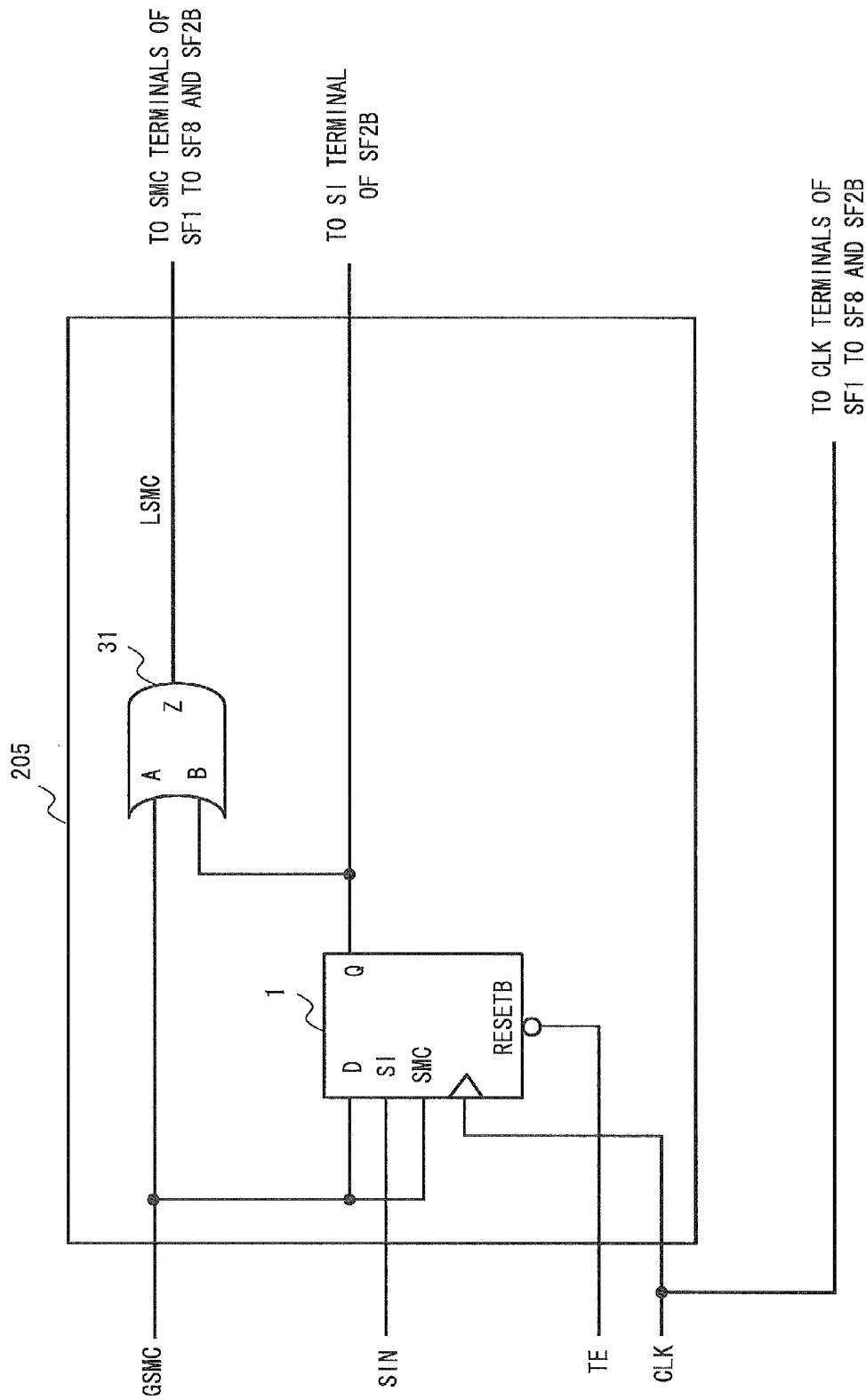
FIG. 5A is a block diagram of a delay fault test pattern generation control circuit according to a third embodiment.
Figure 5B:
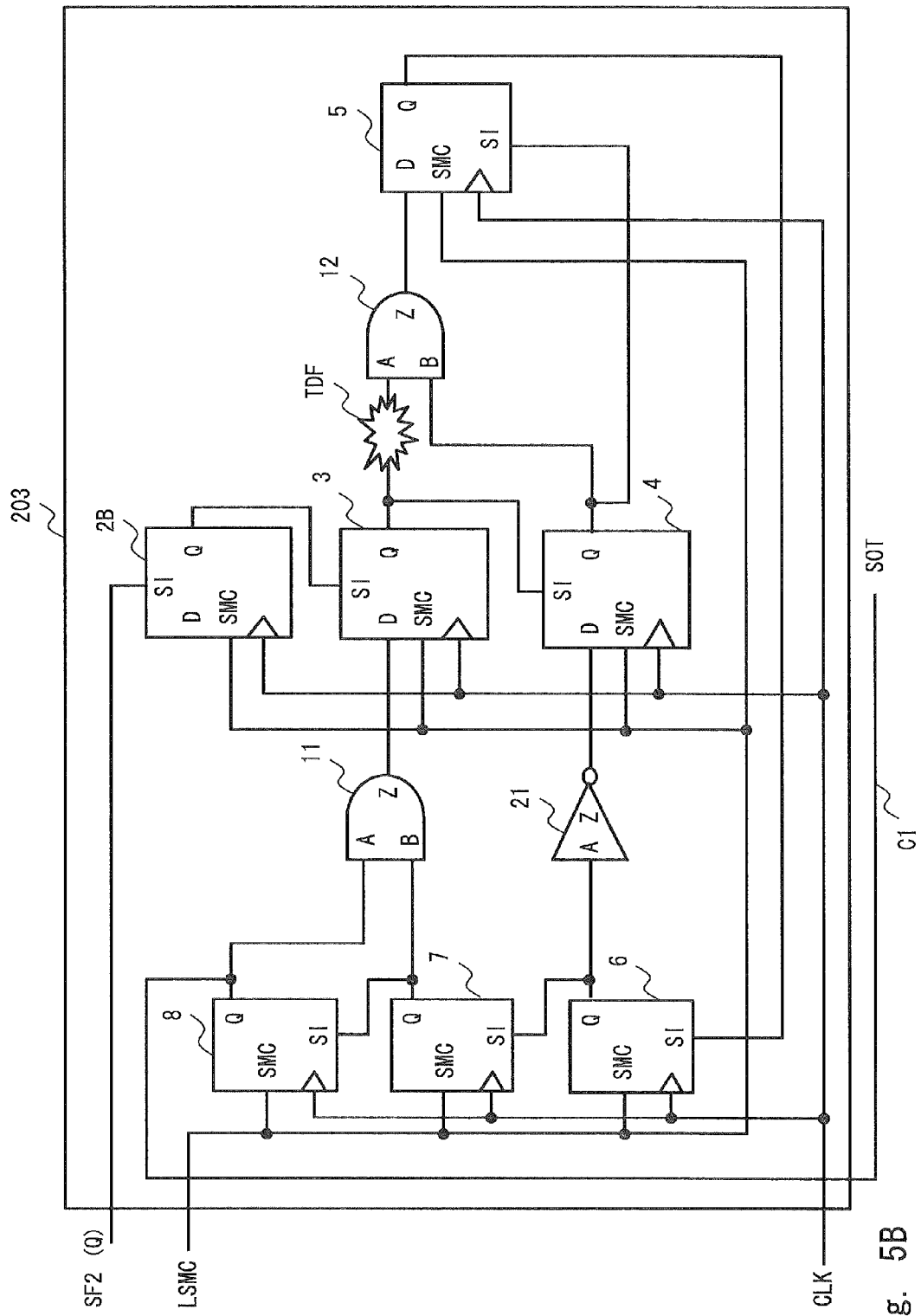
FIG. 5B is a block diagram of a logic circuit according to the third embodiment.

Subsequently, a configuration example of a delay fault test pattern generation control circuit 205 according to a third embodiment, and a configuration example of a logic circuit 203, which is controlled by the delay fault test pattern generation control circuit 205, will be described with reference to FIGS. 5A and 5B.

The delay fault test pattern generation control circuit 205 has a configuration in which the SF 2 of the delay fault test pattern generation control circuit 200 is omitted. The data output terminal (Q) of the SF 1 of the delay fault test pattern generation control circuit 205 is connected to the scan-in terminal (SI) of an SF 2B of the logic circuit 203. The other circuit configuration of the delay fault test pattern generation control circuit 205 is similar to that of the delay fault test pattern generation control circuit 200 shown in FIG. 1, so the description thereof is omitted.

The logic circuit 203 is different from the logic circuit 201 in that the scan FF (SF 2B) is added as a part of a user circuit unit at the fan-in side of the SF 3 on the scan chain (C1). The data output terminal (Q) of the SF 2B is connected to the scan-in terminal (SI) of the SF 3. The scan enable terminal (SMC) of the SF 2B is connected to the signal line of the local scan enable signal (LSMC) which is output by the delay fault test pattern generation control circuit 205. The clock terminal (CLK) of the SF 2B is connected to the signal line of the external clock terminal (CLK). The circuit configuration of the multiplexer-type SF 202 is similar to that shown in FIG. 1, so the description thereof is omitted.

The delay fault test pattern generation control circuit 205 operates in the same manner as in the timing diagram shown in FIGS. 2 and 3. Accordingly, the detailed description of the circuit operation shown in FIG. 5 is omitted. Note that SF 2 (Q) in the timing diagram shown in FIGS. 2 and 3 is replaced with SF 2B(Q).

In the third embodiment, the delay fault test pattern generation control circuit 205 including one RESETB-equipped scan FF and one OR gate is incorporated for each clock domain in the entire circuit. Accordingly, only the delay fault test pattern generation control circuits 205 corresponding to the number of clock domains occupy the area OH.

Also in the third embodiment, the delay fault test pattern generation control circuit 205 is converted into the number of transistors under the same conditions as those of the first embodiment. When 100 delay fault test pattern generation control circuits 205 are incorporated, the area OH is represented by (reset-bar terminal RESETB-equipped scan FF+OR gate)×100=(40+6)×100=4600 Tr. The area OH of the configuration disclosed in Japanese Unexamined Patent Application Publication No. 2008-096440 is represented by (28+6)*20000=680000 Tr. Accordingly, the area OH of the third embodiment is about 1/150 of the area OH of the configuration disclosed in the Japanese Unexamined Patent Application Publication No. 2008-096440. Thus, the third embodiment provides an advantageous effect of reducing the area OH. The third embodiment also provides an advantageous effect of further reducing the area OH as compared with the first and second embodiments.

In the delay fault test pattern generation control circuit 205, the SF 2 and NF2 for setting a toggle value upon generation of the test pattern in the skewed-load mode are not present. Thus, the delay fault coverage of the skewed-load mode may be lowered as compared with the first and second embodiments. However, in the case of generating the test pattern using the ATPG, an interpolation function for generating a test pattern using the broadside mode according to the signal value set to the SF 1 is activated. This also provides an advantageous effect of improving the final delay fault coverage.

While the configuration in which the SF 2B is provided in the logic circuit 203 is described in the third embodiment, similar effects can be obtained also in the configuration in which the SF 2B is omitted.

(Fourth Embodiment)

Figure 6:
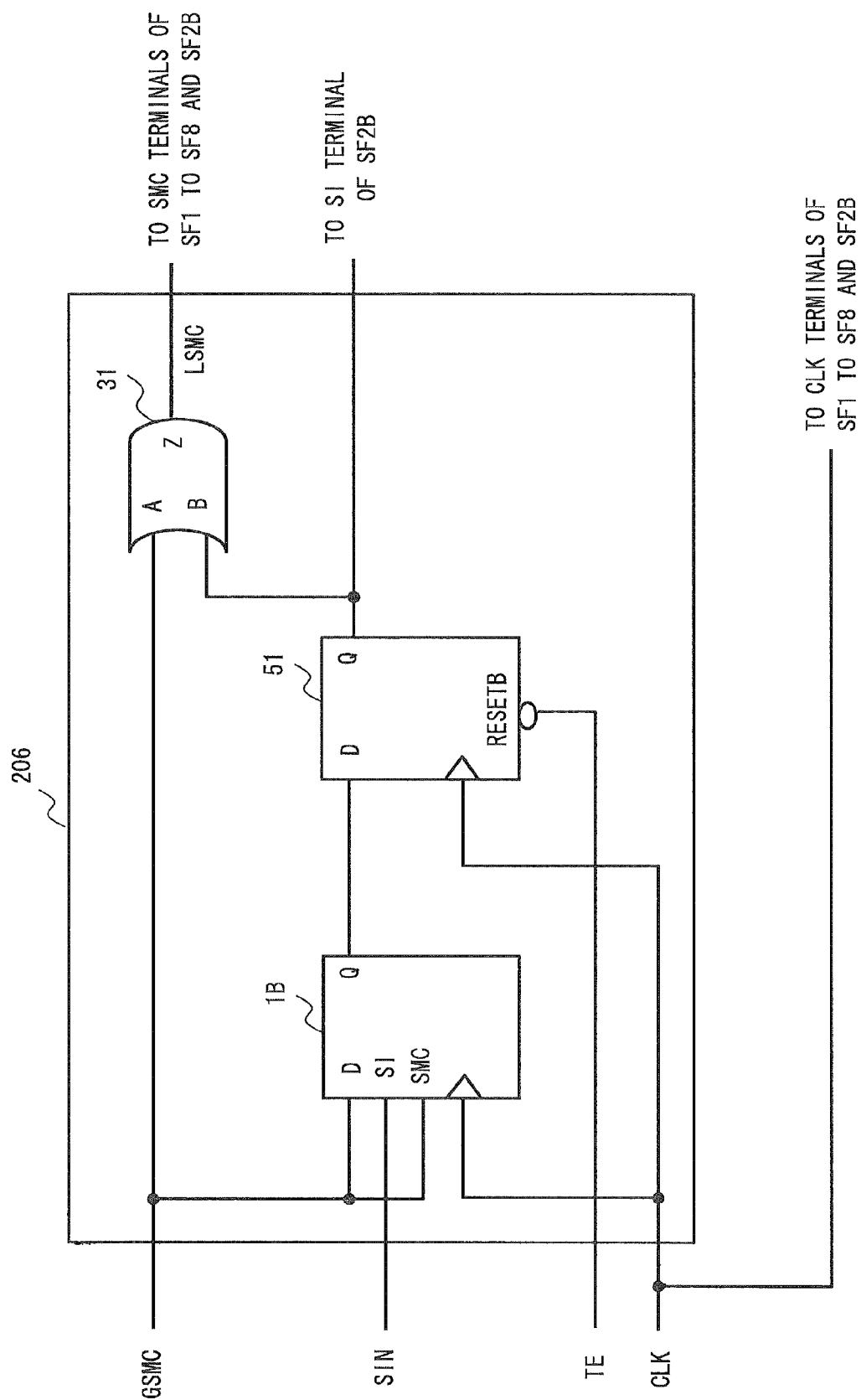
FIG. 6 is a block diagram of a delay fault test pattern generation control circuit according to a fourth embodiment.

Subsequently, a configuration example of a delay fault test pattern generation control circuit 206 according to a fourth embodiment, and a configuration example of the logic circuit 203, which is controlled by the delay fault test pattern generation control circuit 206, will be described with reference to FIG. 6.

The delay fault test pattern generation control circuit 206 has a configuration in which the SF 1 and the SF 2 of the delay fault test pattern generation control circuit 200 are omitted. Further, in the configuration of the delay fault test pattern generation control circuit 206, a normal FF (NF 51) and a scan FF (SF 1B) are added. The NF 51 generates a transition operation for the local scan enable signal (LSMC) at the time when the launch clock operates during the skewed-load operation. The SF 1B generates a transition operation for the local scan enable signal (LSMC) at the time when the capture clock operates. The SF 1B corresponds to a capture-clock-time scan enable control unit that causes the local scan enable signal (LSMC) to transit during the capture clock time.

The data output terminal (Q) of the SF 1B of the delay fault test pattern generation control circuit 206 is connected to the data input terminal (D) of the NF 51. The data output terminal (Q) of the NF 51 is connected to each of the data input terminal (B) of the OR 31 and the scan-in terminal (SI) of the SF 2B of the logic circuit 203. The global scan enable signal (GSMC), which is input to the delay fault test pattern generation control circuit 206, is connected to each of the data terminal (D) and the scan enable terminal (SMC) of the SF 1B and the data input terminal (A) of the OR 31. The scan-in signal (SIN) of the scan chain is connected to the scan-in terminal (SI) of the SF 1B. The scan test mode signal (TE) is connected to the reset-bar terminal (RESETB) of the NF 51. The clock signal (CLK), which is input to the delay fault test pattern generation control circuit 206, is connected to each of the clock terminal (CLK) of the SF 1B and the clock terminal (CLK) of the NF 51. The data output terminal (Z) of the OR 31 outputs the local scan enable signal (LSMC) and is connected to the logic circuit 203.

The circuit configuration of the multiplexer-type SF 202 is similar to that shown in FIG. 1, so the description thereof is omitted. Similarly, the circuit configuration of the logic circuit 203 is similar to that shown in FIG. 5, so the description thereof is omitted.

Figure 7:
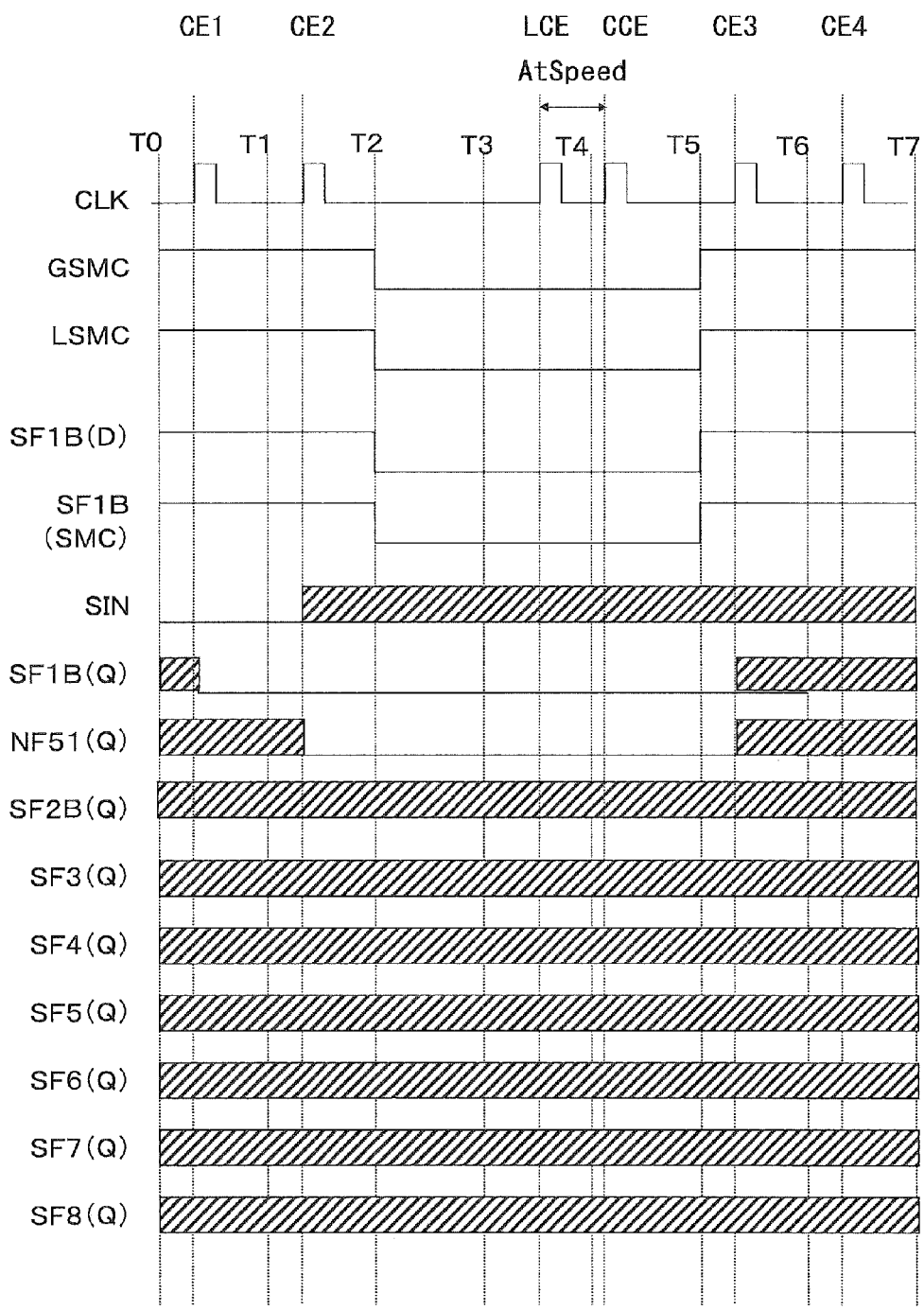
FIG. 7 is a timing diagram for generating a test pattern according to the fourth embodiment.

FIG. 7 is a waveform chart when the LSMC signal of the delay fault test pattern generation control circuit 206 outputs the same waveform as that shown in FIG. 3. In the delay fault test pattern generation control circuit 206, the signal value of the data output signal (Q) of the SF 1B at time (T1) and time (T2) is "0". In this case, at time (T3) and time (T4) before the application of the launch clock and the capture clock at time (LCE) and time (CCE), respectively, the signal value of the data output signal (Q) of the NF 51 is "0". Accordingly, the signal value of the local scan enable terminal (LSMC) is "0" during the capture cycle period from time (T2) to time (T5). The description of the operation of scan FFs subsequent to the SF 2B is omitted.

Figure 8:
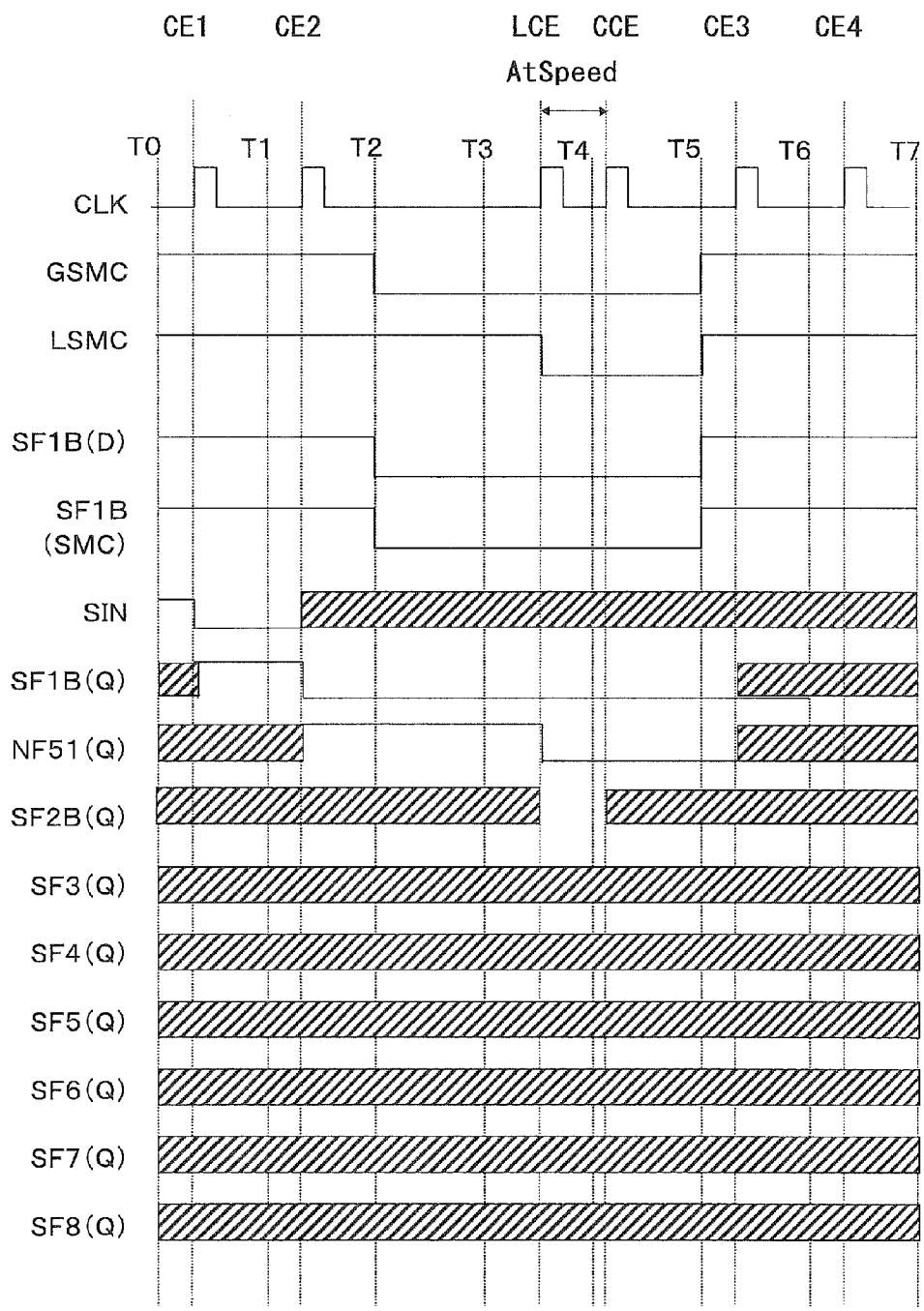
FIG. 8 is a timing diagram for generating a test pattern according to the fourth embodiment.

FIG. 8 is a waveform chart when the LSMC signal of the delay fault test pattern generation control circuit 206 outputs the same waveform as that shown in FIG. 2. A description is given of the case where the signal value of the data output signal (Q) of the SF 1B at time (T1) is "1" and the signal value of the data output signal (Q) of the SF 1B at time (T2) is "0". In this case, at time (T3) before the application of the launch clock at time (LCE), the signal value of the data output signal (Q) of the NF 51 is "1". Further, at time (T4) before the application of the capture clock at time (CCE), the signal value of the data output signal (Q) of the NF 51 is "0". Accordingly, the signal value of the local scan enable terminal (LSMC) in the period from time (LCE) to time (T5) is "0". The description of the operation of scan FFs subsequent to the SF 2B is omitted.

Figure 9:
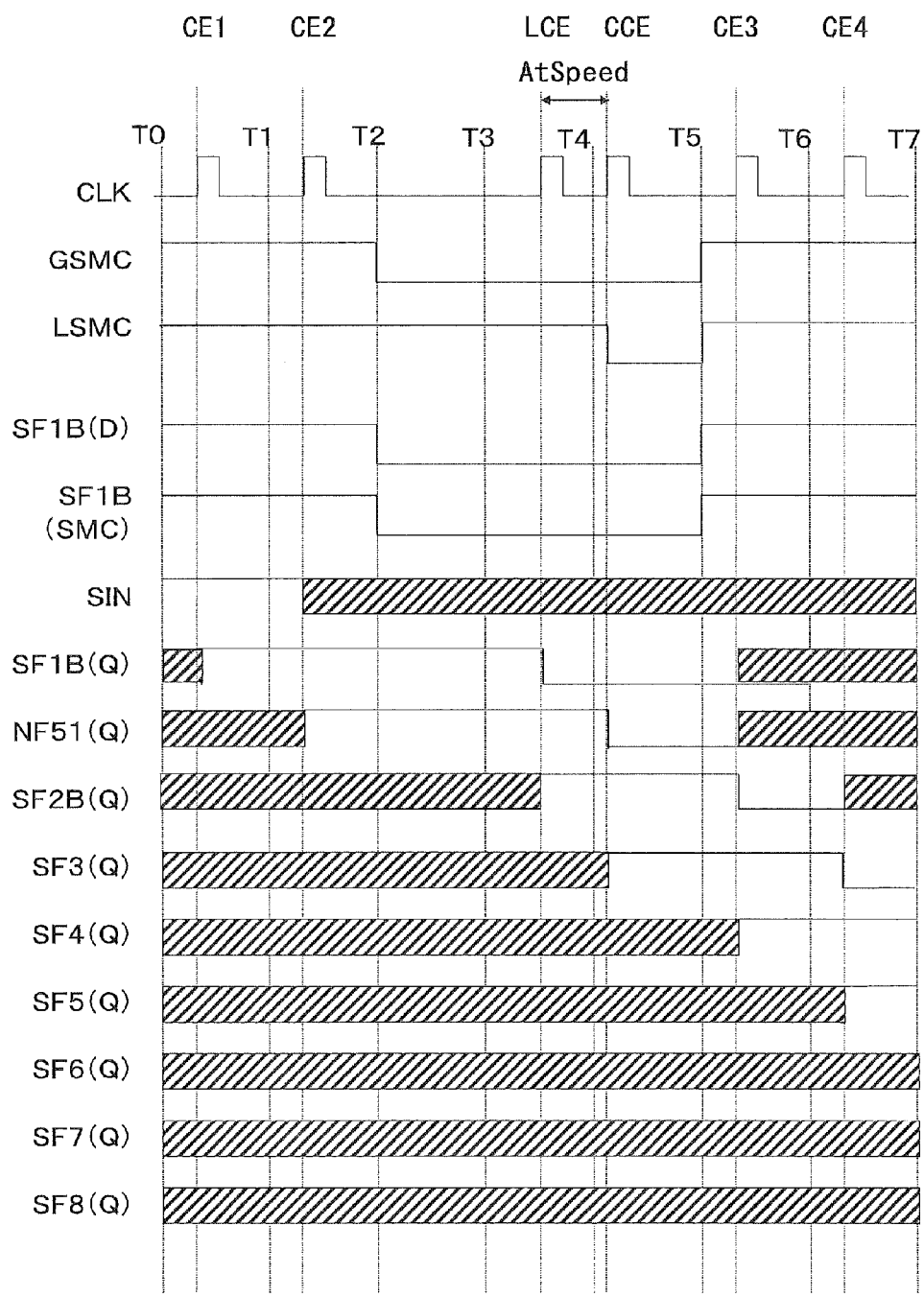
FIG. 9 is a timing diagram for generating a test pattern according to the fourth embodiment.

FIG. 9 illustrates the case where the signal value of the data output signal (Q) of the SF 1B at time (T1) and time (T2) is "1". In this case, at time (T3) and time (T4) before the application of the launch clock and the capture clock at time (LCE) and time (CCE), respectively, the signal value of the data output signal (Q) of the NF 51 is "1". Accordingly, at time (T4), the signal value of the local scan enable terminal (LSMC) is "1", and the signal value of the local scan enable terminal (LSMC) is "0" only in the period from time (CCE) to time (T5). Further, at time (T5), the global scan enable signal (GSMC) returns to "1" and the local scan enable signal (LSMC) also returns to "1". Accordingly, at all clock application times (CE1, CE2, LCD, CCE, CE3, and CE4), the scan enable signals of all the SFs indicate "1". Thus, in the period from time (T0) to time (T7), all the SFs of SF 1B to SF 8 perform a shift register operation.

In the first to third embodiments, the SF 1 plays the role of determining one of the skewed-load mode and the broadside mode, and the role of generating the transition signal of the local scan enable signal (LSMC) in each of the skewed-load mode and the broadside mode. On the other hand, in the fourth embodiment, the NF 51 plays the role of generating the transition signal of the local scan enable signal (LSMC) during the launch clock time in the skewed-load mode.

Furthermore, the fourth embodiment is different from the first to third embodiments in that the SF 1B generates the transition signal of the local scan enable signal (LSMC) during the capture clock time.

Also in the fourth embodiment, the delay fault test pattern generation control circuit 206 is converted into the number of transistors under the same conditions as those of the first embodiment. Assuming that the number of transistors of the reset-bar terminal RESETB-equipped normal FF is 30 Tr and the other conditions are the same as those of the embodiment 1, the area OH of the fourth embodiment is represented by (38+30+6)×100=7400 Tr, and the area OH of the configuration disclosed in Japanese Unexamined Patent Application Publication No. 2008-096440 is represented by (28+6)×20000=680000 Tr. The area OH of the fourth embodiment is 1/90 of the area OH of the configuration disclosed in Japanese Unexamined Patent Application Publication No. 2008-096440. Accordingly, the fourth embodiment provides an advantageous effect of reducing the area OH.

In the delay fault test pattern generation control circuit 206, the signal value of the local scan enable terminal (LSMC) is set to "1" during capturing, thereby allowing each scan FF to capture the signal value from the scan chain during capturing. In a circuit including a scan compression circuit, when a scan FF irrelevant to a target fault captures a user logic, i.e., an X value from a combinational circuit such as the AND 11, the X value may be propagated to the compression circuit, which may lower the fault coverage. The capturing of the signal value from the scan chain during capturing prevents each scan FF from capturing the X value and also prevents the X value from being propagated to the scan compression circuit. As a result, the delay fault test pattern generation control circuit 206 also provides an advantageous effect of improving the final delay fault coverage as compared with the delay fault test pattern generation control circuit 200.

(Fifth Embodiment)

Figure 10A:
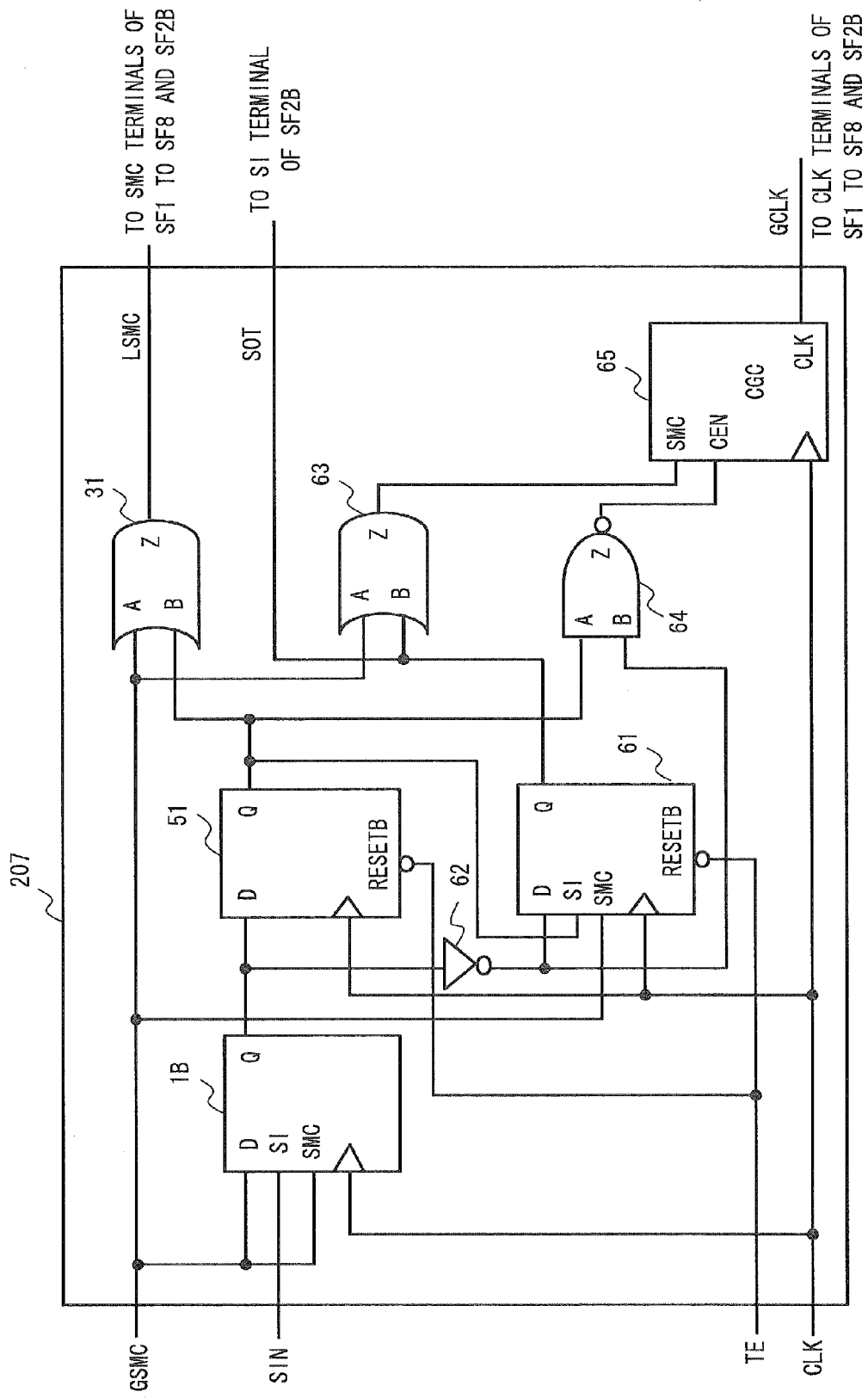
FIG. 10A is a block diagram of a delay fault test pattern generation control circuit according to a fifth embodiment.

Subsequently, a configuration example of a delay fault test pattern generation control circuit 207 according to a fifth embodiment will be described with reference to FIG. 10A.

The delay fault test pattern generation control circuit 207 has a configuration in which a scan FF (SF 61), an inverter (INV 62), an OR gate (OR 63), a NAND gate (NAND 64), and a clock gating cell (CGC 65) are added to the delay fault test pattern generation control circuit 206. The SF 1B corresponds to the capture-clock-time scan enable control unit that causes the local scan enable signal (LSMC) to transit during the capture clock time. The SF 1B corresponds to a capture clock output control unit that outputs a gated clock signal (GCLK) during the capture clock time. The SF 61 corresponds to a launch clock output control unit that outputs the gated clock signal (GCLK) during the launch clock time. When the local scan enable signal (LSMC) is "0" during the capture clock time, i.e., when the scan FFs (SF 1 to SF 8 and SF 2B) capture signals from the D terminal of each scan FF during the capture clock time, the INV 62 generates a control signal necessary for forcibly outputting the gated clock signal (GCLK). The OR 63 corresponds to a control unit that causes the gated clock signal (GCLK) to be output during the shift cycle time. The NAND 64 corresponds to a capture clock stop control unit that forcibly stops supply of the gated clock signal (GCLK) when the SF 1B and the NF 51 have status values of "0" and "1", respectively, during the capture clock time, i.e., when the scan FFs (SF 1 to SF 8 and SF 2B) capture signals from the SI terminal of each scan FF during the capture clock time.

The data output terminal (Q) of the SF 1B of the delay fault test pattern generation control circuit 207 is connected to each of the input terminal (D) of the NF 51 and the input terminal of the INV 62. The data output terminal (Q) of the NF 51 is connected to each of the data input terminal (B) of the OR 31, the data input terminal (A) of the NAND 64, and a scan input terminal (SI) of the SF 61. The data output terminal (Q) of the SF 61 is connected to the data input terminal (B) of the OR 63. The output signal of the SF 61 is output as the scan-output signal (SOT) of the delay fault test pattern generation control circuit 207 and is supplied to the logic circuit 203. The output terminal (Z) of the OR 63 is connected to the scan enable terminal (SMC) of the CGC 65. The data output terminal (Z) of the NAND 64 is connected to the clock enable terminal (CEN) of the CGC 65. The output terminal of the INV 62 is connected to each of the data input terminal (D) of the SF 61 and the data input terminal (B) of the NAND 64. The scan-in signal (SIN) of the scan chain is connected to the scan-in terminal (SI) of the SF 1B. The scan test mode signal (TE) is connected to each of the reset-bar terminal (RESETB) of the NF 51 and the reset-bar terminal (RESETS) of the SF 61. The clock signal (CLK), which is input to the delay fault test pattern generation control circuit 207, is connected to each of the clock terminal (CLK) of the SF 1B, the clock terminal (CLK) of the NF 51, the clock terminal (CLK) of the SF 61, and the clock terminal (CLK) of the CGC 65. The global scan enable signal (GSMC), which is input to the delay fault test pattern generation control circuit 207, is connected to each of the data input terminal (D) and the scan enable terminal (SMC) of the SF 1B, the scan enable terminal (SMC) of the SF 61, the data input terminal (A) of the OR 31, and the data input terminal (A) of the OR 63. The output signal from the data output terminal (Z) of the OR 31 is output as the local scan enable signal (LSMC) and is supplied to the logic circuit 203. The output signal from the gated clock terminal (GCLK) of the CGC 65 is output as the gated clock signal (GCLK) and is supplied to the logic circuit 203.

Subsequently, the circuit configuration of the clock gating cell (CGC 65) will be described with reference to FIG. 10B. The clock gating cell (CGC 65) includes an OR gate (OR 66), a latch (LAT 67), and an AND gate (AND 68). The scan enable terminal (SMC) of the CGC 65 is connected to the input terminal (A) of the OR 66. The clock enable terminal (CEN) of the CGC 65 is connected to the data input terminal (B) of the OR 66. The data output terminal (Z) of the OR 66 is connected to the data input terminal (D) of the LAT 67. The data output terminal (Q) of the LAT 67 is connected to the data input terminal (A) of the AND 68. The data output terminal (Z) of the AND 68 is connected to the gated clock terminal (GCLK) of the CGC 65. The clock terminal (CLK) of the CGC 65 is connected to each of the gate bar terminal (GB) of the LAT 67 and the data input terminal (B) of the AND 68.

Subsequently, the block diagram of the delay fault test pattern generation control circuit 207 according to the fifth embodiment will be described with reference to FIG. 10C. The global scan enable signal (GSMC) is supplied to each of a capture-clock-time scan enable control unit 301, a scan enable signal output unit 303, and a capture-clock-time gated clock control unit 304. The scan test mode signal (TE) is supplied to each of a test pattern generation mode control unit 302 and the capture-clock-time gated clock control unit 304. The external clock signal (CLK) is supplied to each of the capture-clock-time scan enable control unit 301, the test pattern generation mode control unit 302, and the capture-clock-time gated clock control unit 304. The output signal of the capture-clock-time scan enable control unit 301 is supplied to each of the test pattern generation mode control unit 302 and the capture-clock-time gated clock control unit 304. The output signal of the test pattern generation mode control unit 302 is supplied to each of the scan enable signal output unit 303 and the capture-clock-time gated clock control unit 304. The output signal of the scan enable signal output unit 303 is output as the local scan enable signal (LSMC). The output signal of the capture-clock-time gated clock control unit 304 is output as the gated clock signal (GCLK). The capture-clock-time scan enable control unit 301 is composed of the SF 1B. The test pattern generation mode control unit 302 is composed of the NF 51. The scan enable signal output unit 303 is composed of the OR 31. The capture-clock-time gated clock control unit 304 is composed of the INV 62, the NF 61, the OR 63, the NAND 64, and the CGC 65. The delay fault test pattern generation control circuit 207 also has a scan chain configuration in which the SIN terminal and the SOT terminal are set as a start point and an end point, respectively, but the description of the scan chain configuration is herein omitted.

The circuit configuration of the multiplexer-type SF 202 is similar to that shown in FIG. 10, so the description thereof is omitted. Similarly, the circuit configuration of the logic circuit 203 is similar to that shown in FIG. 5B, so the description thereof is omitted.

Figure 11:
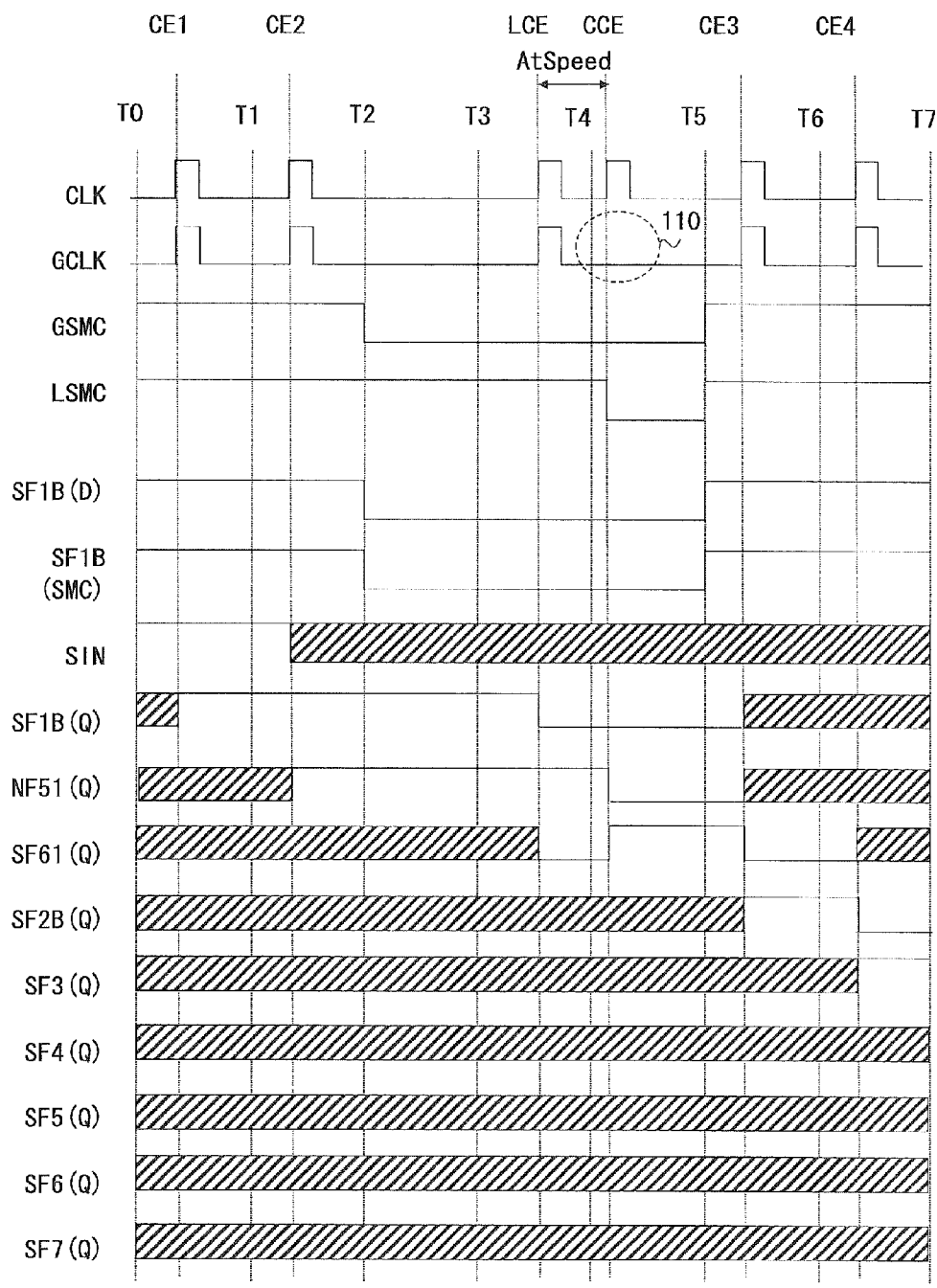
FIG. 11 is a timing diagram for generating a test pattern according to the fifth embodiment.

FIG. 11 is a waveform chart when the LSMC signal of the delay fault test pattern generation control circuit 207 outputs the same waveform as that shown in FIG. 9. FIG. 11 differs from FIG. 9 in that the waveform of the gated clock signal (GCLK) which is the output signal of the delay fault test pattern generation control circuit 207 is added. The waveforms of signals (signals ranging from CLK to NF 51) other than the gated clock signal (GCLK) of the delay fault test pattern generation control circuit 207 are the same as those shown in FIG. 9, so the description thereof is omitted. When the status values of the SF 1B and the NF 51 are "1" and "1", respectively, at time (T3), the status values of the SF 1B and the NF 51 are "0" and "1", respectively, and the status value of the SF 61 is "0" at time (T4). Accordingly, when the scan test mode signal (TE) indicates "1", the data output terminals of the OR 63 and the NAND 64 indicate "0" and "0", respectively, at time (T4). Thus, at time (CCE), the CGC 65 cannot output the clock signal (CLK) of the delay fault test pattern generation control circuit 207. This makes it impossible to supply the capture clock signal to the logic circuit 203 from the gated clock terminal (GCLK) of the delay fault test pattern generation control circuit 207 as shown in an area 110. At time (LCE), the SF 61 captures the signal value "0" which is obtained such that the signal value "1" at time (T3) of the SF 1B is inverted by the INV 62. Also at time (CCE), the SF 61 operates in a similar manner and captures the signal value "1". At time (CE3), the SF 61 captures the signal value "0" of the NF 51 at time (T5). At time (CE3), the SF 2B of the logic circuit 203 captures the signal value "1" of the SF 61 at time (T5). After time (T5), the scan shift operation is carried out, so the description of the scan shift operation of the SF 61 to the SF 7 is omitted.

In the fourth embodiment, the SF 1B and the NF 51 play the role of generating the transition signal of the local scan enable signal (LSMC) during the launch clock time and the capture clock time. On the other hand, in the fifth embodiment, when the transition of the local scan enable signal (LSMC) occurs, for example, when capturing of signals from the SI terminals of the scan FFs (SF 1 to SF 8 and SF 2B) in the logic circuit 203 occurs during the capture clock time, the CGC 65 performs control to prevent the capture clock signal from being supplied to the logic circuit 203.

Also in the fifth embodiment, the delay fault test pattern generation control circuit 207 is converted into the number of transistors under the same conditions as those of the first embodiment. Assuming that the number of transistors of the inverter is 2 Tr; the number of transistors of the 2-input NAND gate is 4 Tr; the number of transistors of the clock gating cell is 20 Tr; and the other conditions are the same as those of the first embodiment, the area OH of the fifth embodiment is represented by (38+30+40+2+6+6+4+20)× 100-14600 Tr, and the area OH of the configuration disclosed in Japanese Unexamined Patent Application Publication No. 2008-096440 is represented by (28+6)×20000-680000 Tr. The area OH of the fifth embodiment is about 1/46 of the area OH of the configuration disclosed in Japanese Unexamined Patent Application Publication No. 2008-096440. Accordingly, the fifth embodiment provides an advantageous effect of reducing the area OH.

As in the fourth embodiment, in the delay fault test pattern generation control circuit 207, the signal value of the local scan enable terminal (LSMC) is set to "1" during capturing, thereby allowing each scan FF to stop the capture operation from the data input terminal during capturing. In a circuit including a scan compression circuit, when a scan FF irrelevant to a target fault captures a user logic, i.e., an X value from a combinational circuit such as the AND 11, the X value may be propagated to the compression circuit, which may lower the fault coverage. Suppression of the capture operation during capturing prevents each scan FF from capturing the X value and also prevents the X value from being propagated to the scan compression circuit. As a result, the delay fault test pattern generation control circuit 207 also provides an advantageous effect of improving the final delay fault coverage as compared with the delay fault test pattern generation control circuit 200.

Furthermore, in the fifth embodiment, capturing of signals from the SI terminals of the scan FFs (SF 1 to SF 8 and SF 2B) in the logic circuit 203 does not occur during the capture clock time. Therefore, there is no need to take into consideration the at-speed transfer on the scan chain during timing-driven layout. Accordingly, the fifth embodiment also provides an advantageous effect of shortening the period of designing the timing-driven layout.

(Sixth Embodiment)

Figure 12:
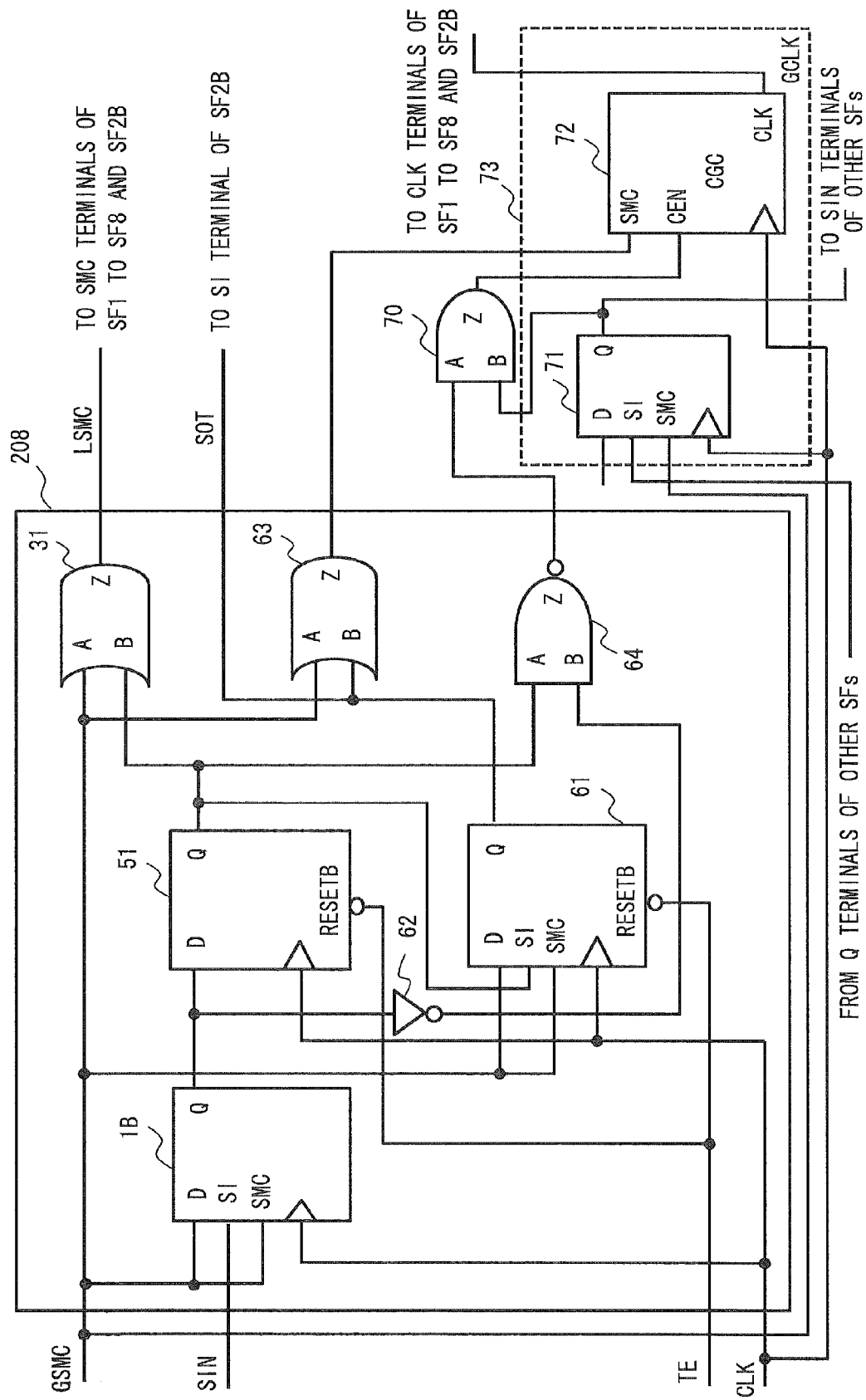
FIG. 12 is a block diagram of a delay fault test pattern generation control circuit according to a sixth embodiment.

Subsequently, a configuration example of a delay fault test pattern generation control circuit 208, which is used to control the logic circuit 203, a configuration example of a logic circuit 73 including a clock gating cell (CGC 72) and a scan FF (SF 71), and a configuration example of an AND 70 according to a sixth embodiment will be described with reference to FIG. 12.

The delay fault test pattern generation control circuit 208 has a configuration in which the clock gating cell (CGC 65) is omitted from the delay fault test pattern generation control circuit 207 and the data input terminal of the SF 61 is connected to the GSMC. The configurations other than the connection designation of the data input terminal of each of the clock gating cell (CGC 65) and the SF 61 are the same as those of the delay fault test pattern generation control circuit 207, so the description of the configuration of the delay fault test pattern generation control circuit 208 is omitted.

The data output terminal (Z) of the OR 31 of the delay fault test pattern generation control circuit 208 is connected to the scan enable terminal (SMC) of the SF 1 to SF 8 and SF 2B of the logic circuit 203. The data output terminal (Z) of the OR 63 of the delay fault test pattern generation control circuit 208 is connected to the scan enable terminal (SMC) of the CGC 72. The data output terminal (Z) of the NAND 64 of the delay fault test pattern generation control circuit 208 is connected to the data input terminal (A) of the AND 70. The data output terminal (Z) of the AND 70 is connected to the clock enable terminal (CEN) of the CGC 72. The data output terminal of the SF 71 of the logic circuit 73 is connected to each of the data input terminal (B) of the AND 70 and the scan input terminals of other scan FFs of the logic circuit 73. The data input terminal (D) and the scan input terminal (SI) of the SF 71 are connected to other logic gates of the logic circuit 73, but the description thereof is omitted. The scan enable terminal (SMC) of the SF 71 of the logic circuit 73 is supplied with the GSMC signal which is supplied to the delay fault test pattern generation control circuit 208. The clock terminals (CLK) of the SF 71 and the CGC 72 of the logic circuit 73 are supplied with the same clock signal CLK as that supplied to the delay fault test pattern generation control circuit 208. The gated clock terminal (GCLK) of the CGC 72 of the logic circuit 73 is connected to the clock terminals (CLK) of the SF 1 to SF 8 and SF 2B of the logic circuit 203.

The delay fault test pattern generation control circuit 208 implements the same functions as those of the delay fault test pattern generation control circuit 207 by combining the clock gating cell CGC 72, which is preliminarily included in the logic circuit 73, and the AND 70, which is newly added, in place of the clock gating cell CGC 65 held in the delay fault test pattern generation control circuit 207.

The circuit configuration of the clock gating cell CGC 72 is similar to that of the clock gating cell CGC 65, so the description thereof is omitted. The SF may be a multiplexer-type SF, for example, and the circuit configuration of the multiplexer-type SF 202 is similar to that shown in FIG. 1B, so the description thereof is omitted. Similarly, the circuit configuration of the logic circuit 203 is similar to that shown in FIG. 5B, so the description thereof is omitted.

The operation of the delay fault test pattern generation control circuit 208, which includes the operations of the AND 70 and the CGC 72, is similar to the operation of the delay fault test pattern generation control circuit 207 illustrated in FIG. 11, so the description thereof is omitted.

Also in the sixth embodiment, the delay fault test pattern generation control circuit 208 is converted into the number of transistors under the same conditions as those of the first embodiment. Assume in the sixth embodiment that the delay fault test pattern generation control circuit 208 and the AND 70 are configured in combination. Assuming that the number of transistors of the inverter is 2 Tr; the number of transistors of the 2-input NAND gate is 4 Tr; and the other conditions are the same as those of the first embodiment, the area OH of the sixth embodiment is represented by (38+30+40+2+6+6+4+6)×100=13200 Tr, and the area OH of the configuration disclosed in Japanese Unexamined Patent Application Publication No. 2008-096440 is represented by (28+6)×20000=680000 Tr. Thus, the area OH of the sixth embodiment is about ⅕₁ of the area OH of the configuration disclosed in Japanese Unexamined Patent Application Publication No. 2008-096440. Accordingly, the sixth embodiment provides an advantageous effect of reducing the area OH.

As in the fifth embodiment, in the delay fault test pattern generation control circuit 208, the signal value of the local scan enable terminal (LSMC) is set to "1" during capturing, thereby allowing each scan FF to stop the capture operation for capturing data from the data input terminal during capturing. In a circuit including a scan compression circuit, when a scan FF irrelevant to a target fault captures a user logic, i.e., an X value from a combinational circuit such as the AND 11, the X value may be propagated to the compression circuit, which may lower the fault coverage. Suppression of the capture operation during capturing prevents each scan FF from capturing the X value and also prevents the X value from being propagated to the scan compression circuit. As a result, the delay fault test pattern generation control circuit 208 also provides an advantageous effect of improving the final delay fault coverage as compared with the delay fault test pattern generation control circuit 200.

Further, in the sixth embodiment, capturing of signals from the SI terminals of the scan FFs (SF 1 to SF 8 and SF 2B) in the logic circuit 203 does not occur during the capture clock time. Therefore, there is no need to take into consideration the at-speed transfer on the scan chain during timing-driven layout. Accordingly, the sixth embodiment also provides an advantageous effect of shortening the period of designing the timing-driven layout.

Furthermore, in the sixth embodiment, the delay fault test pattern generation control circuit 208 is not disposed on a clock line of an existing circuit. Therefore, the sixth embodiment also provides an advantageous effect of suppressing an increase in skew on the clock line.

(Seventh Embodiment)

Figure 13:
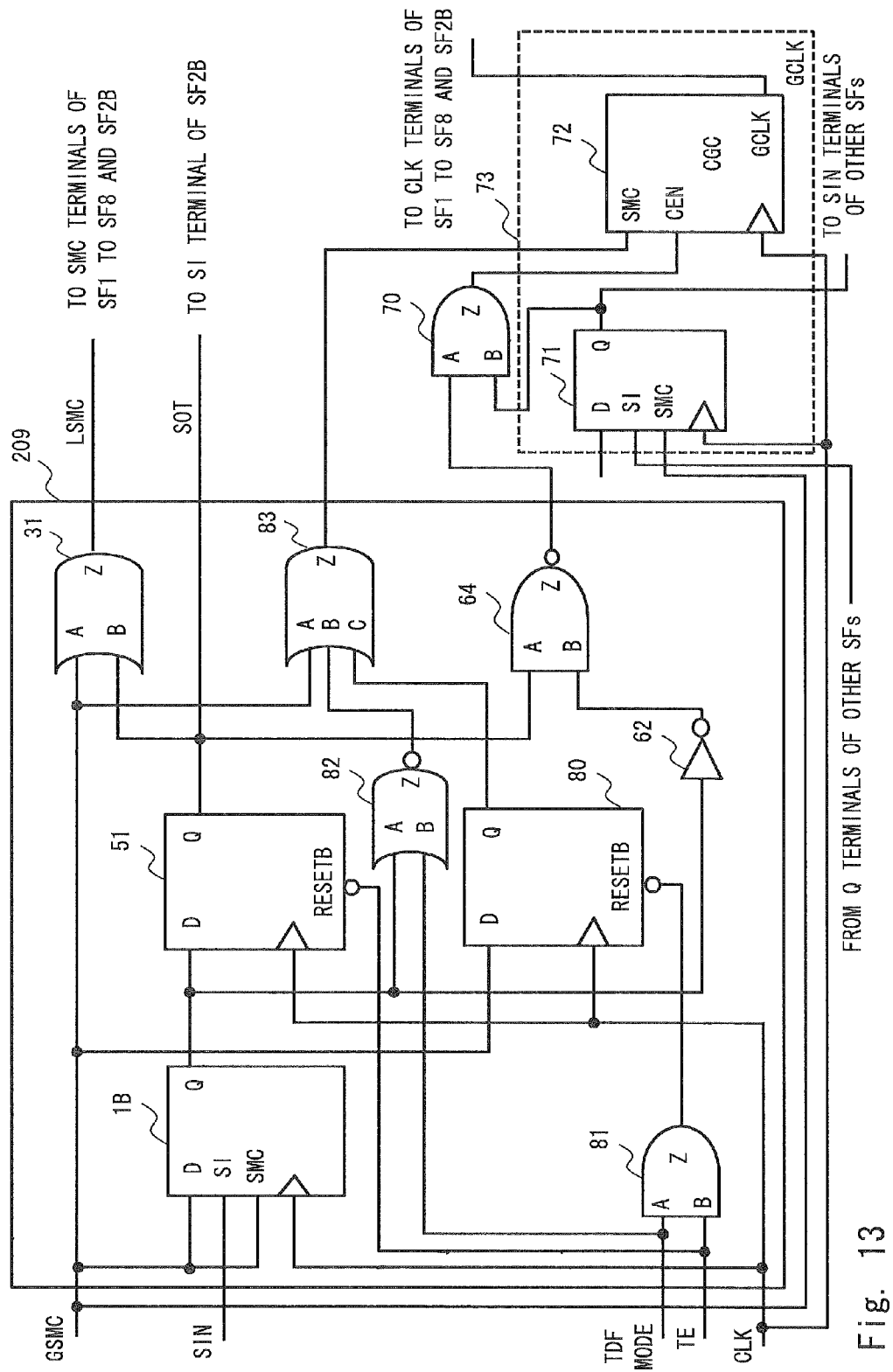
FIG. 13 is a block diagram of a delay fault test pattern generation control circuit according to a seventh embodiment.

Subsequently, a configuration example of a delay fault test pattern generation control circuit 209, which is used to control the logic circuit 203, a configuration example of the logic circuit 73, which is controlled by the delay fault test pattern generation control circuit 209, and a configuration example of the AND gate (AND 70) according to a seventh embodiment will be described with reference to FIG. 13.

The delay fault test pattern generation control circuit 209 has a configuration in which an AND gate (AND 81) and an NOR gate (NOR 82) are added to the delay fault test pattern generation control circuit 208; the scan FF (SF 61) is replaced with a normal FF (NF 80); and the 2-input OR gate (OR 63) is replaced with a 3-input OR gate (OR 83). The SF 1B corresponds to each of the capture-clock-time scan enable control unit that causes the local scan enable signal (LSMC) to transit during the capture clock time, and the capture clock output control unit that causes the gated clock signal (GCLK) to be output during the capture clock time. The NF 80 corresponds to the launch clock output control unit that causes the gated clock signal (GCLK) to be output during the launch clock time. When the local scan enable signal (LSMC) indicates "0" during the capture clock time, i.e., when the scan FFs (SF 1 to SF 8 and SF 2B) capture signals from the D terminal of each scan FF during the capture clock time, the INV 62 generates a control signal necessary for forcibly outputting the gated clock signal (GCLK). The OR 83 corresponds to the control unit that causes the gated clock signal (GCLK) to be output during the shift cycle time. The NAND 64 corresponds to the capture clock stop control unit that forcibly stops supply of the gated clock signal (GCLK) when the SF 1B and the NF 51 have status values of "0" and "1", respectively, during the capture clock time, i.e., when the scan FFs (SF 1 to SF 8 and SF 2B) capture signals from the SI terminal of each scan FF during the capture clock time.

The data output terminal (Q) of the SF 1B of the delay fault test pattern generation control circuit 209 is connected to each of the data input terminal (D) of the NF 51, the data input terminal (A) of the NOR 82, and the input terminal of the INV 62. The data output terminal (Q) of the NF 51 is connected to each of the data input terminal (B) of the OR 31 and the data input terminal (A) of the NAND 64, and the output signal of the data output terminal (Q) of the NF 51 is output as the scan-output signal (SOT) of the delay fault test pattern generation control circuit 209 and is supplied to the logic circuit 203. The data output terminal (Z) of the OR 83 is connected to the scan enable terminal (SMC) of the CGC 72. The data output terminal (Z) of the NAND 64 is connected to the data input terminal (A) of the AND 70. The data output terminal (Z) of the AND 70 is connected to the clock enable terminal (CEN) of the CGC 72. The output terminal of the INV 62 is connected to the data input terminal (B) of the NAND 64. The scan-in signal (SIN) of the scan chain is connected to the scan-in terminal (SI) of the SF 1B. The scan test mode signal (TE) is connected to each of the reset-bar terminal (RESETB) of the NF 51 and the data input terminal (B) of the AND 81. A delay fault test mode signal (TDFMODE) of the delay fault test pattern generation control circuit 209 indicates "0" at the time of generating a stuck-at fault test pattern, and indicates "1" in the other modes including a mode for generating a delay fault test pattern. The delay fault test mode signal (TDFMODE) is connected to each of the data input terminal (A) of the AND 81 and the data input terminal (B) of the NOR 82. The data output terminal (Z) of the AND 81 is connected to the reset-bar terminal (RESETB) of the NF 80. The data output terminal (Z) of the NOR 82 is connected to the data input terminal (B) of the OR 83. The clock signal (CLK), which is input to the delay fault test pattern generation control circuit 209, is connected to each of the clock terminal (CLK) of the SF 1B, the clock terminal (CLK) of the NF 51, and the clock terminal (CLK) of the NF 80. The global scan enable signal (GSMC), which is input to the delay fault test pattern generation control circuit 209, is connected to each of the data input terminal (D) and the scan enable terminal (SMC) of the SF 1B, the data input terminal (D) of the NF 80, the data input terminal (A) of the OR 31, and the data input terminal (A) of the OR 83. The output signal of the data output terminal (Z) of the OR 31 is output as the local scan enable signal (LSMC) and is supplied to the logic circuit 203. The data output terminal (Q) of the NF 80 is connected to a data input terminal (C) of the OR 83. The clock terminals of the SF 71 and the CGC 72 of the logic circuit 73 are supplied with the same clock signal as that input to the delay fault test pattern generation control circuit 209. The output signal from the gated clock terminal (GCLK) of the CGC 71 is output as the gated clock signal (GCLK) and is supplied to the logic circuit 203.

The circuit configuration of the clock gating cell CGC 72 is similar to that of the clock gating cell CGC 65, so the description thereof is omitted. The circuit configuration of the multiplexer-type SF 202 is similar to that shown in FIG. 1B, so the description thereof is omitted. Similarly, the circuit configuration of the logic circuit 203 is similar to that shown in FIG. 5B, so the description thereof is omitted.

Figure 14:
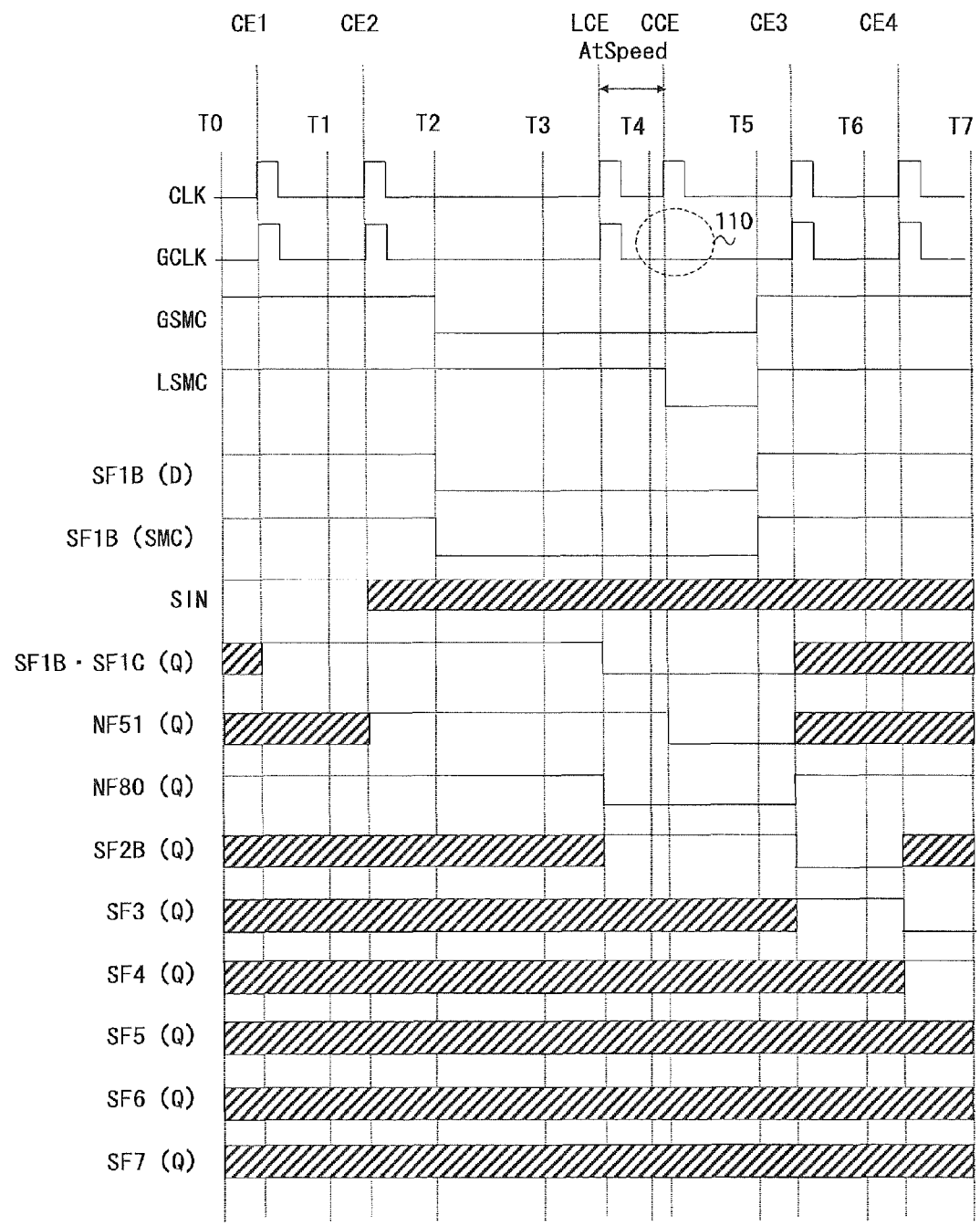
FIG. 14 is a timing diagram for generating a test pattern according to the seventh embodiment.

FIG. 14 is a waveform chart when the LSMC signal of the delay fault test pattern generation control circuit 209 outputs the same waveform as that shown in FIG. 9. FIG. 14 differs from FIG. 9 in that the waveform of the gated clock signal (GCLK) which is the output signal of the CGC 72 controlled by the delay fault test pattern generation control circuit 209 is added. The waveforms of signals (signals ranging from CLK to NF 51) other than the gated clock signal (GCLK) of the CGC 72 controlled by the delay fault test pattern generation control circuit 209 are the same as those shown in FIG. 9, so the description thereof is omitted. When the status values of the SF 1B and the NF 51 are "1" and "1", respectively, at time (T3), the status values of the SF 1B and the NF 51 are "0" and "1", respectively, and the status value of the NF 80 is "0" at time (T4). Accordingly, when both the scan test mode signal (TE) and the delay fault test mode signal (TDFMODE) indicate "1", the data output terminals of the OR 83 and the NAND 64 indicate "0" and "0", respectively. Thus, at time (CCE), the CGC 72 cannot output the clock signal (CLK) supplied to the delay fault test pattern generation control circuit 209. This makes it impossible to supply the capture cock signal to the logic circuit 203 from the gated clock terminal (GCLK) of the CGC 72, which is controlled by the delay fault test pattern generation control circuit 209, as shown in the area 110. Until time (T3), the NF 80 indicates the logical value "1" of the GSMC signal, which is captured until time (CE2), and captures the signal value "0" of the GSM at each of time (LCE) and time (CCE). At time (CE3), the NF 80 captures the signal value "1" of the GSMC. At time (CE3), the SF 2B of the logic circuit 203 captures the signal value "0" of the NF 51 at time (T5). After time (T5), the scan shift operation is carried out, so the description of the scan shift operation of the SF 2B to the SF 7 is omitted.

In the fourth embodiment, the SF 1B and the NF 51 play the role of generating the transition signal of the local scan enable signal (LSMC) during the launch clock time and the capture clock time. On the other hand, in the seventh embodiment, when the transition of the local scan enable signal (LSMC) occurs, for example, when capturing of signals from the SI terminals of the scan FFs (SF 1 to SF 8 and SF 2B) in the logic circuit 203 occurs during the capture clock time, the CGC 72 performs control to prevent the capture clock signal from being supplied to the logic circuit 203. In the sixth embodiment, when the logical values of the SF 1B and the NF 51 are "1" and "1", respectively, the SF 61 controls whether or not to supply the launch clock to the logic circuit 203 from the CGC 72 during the launch clock time. On the other hand, in the seventh embodiment, since the signal value of the NF 80 is "1" during the launch clock time, the launch clock is supplied to the logic circuit 203 without fail.

Also in the seventh embodiment, the delay fault test pattern generation control circuit 209 is converted into the number of transistors under the same conditions as those of the first embodiment. Assume in the seventh embodiment that the delay fault test pattern generation control circuit 209 and the AND 70 are configured in combination. Assuming that the number of transistors of the inverter is 2 Tr; the number of transistors of each of the 2-input NAND gate and the 2-input NOR gate is 4 Tr; the number of transistors of the 3-input OR gate is 8 Tr; and the other conditions are the same as those of the first embodiment, the area OH of the seventh embodiment is represented by (38+30+30+2+4+4+6+6+8+6)×100=13400 Tr, and the area OH of the configuration disclosed in Japanese Unexamined Patent Application Publication No. 2008-096440 is represented by (28+6)×20000=680000 Tr. Thus, the area OH of the seventh embodiment is about 1/50 of the area OH of the configuration disclosed in Japanese Unexamined Patent Application Publication No. 2008-096440. Accordingly, the seventh embodiment provides an advantageous effect of reducing the area OH.

As in the fourth embodiment, in the delay fault test pattern generation control circuit 209, the signal value of the local scan enable terminal (LSMC) is set to "1" during capturing, thereby allowing each scan FF to stop the capture operation from the data input terminal during capturing. In a circuit including a scan compression circuit, when a scan FF irrelevant to a target fault captures a user logic, i.e., an X value from a combinational circuit such as the AND 11, the X value may be propagated to the compression circuit, which may lower the fault coverage. Suppression of the capture operation during capturing prevents each scan FF from capturing the X value and also prevents the X value from being propagated to the scan compression circuit. As a result, the delay fault test pattern generation control circuit 209 also provides an advantageous effect of improving the final delay fault coverage as compared with the delay fault test pattern generation control circuit 200.

Further, in the seventh embodiment, capturing of signals from the SI terminals of the scan FFs (SF 1 to SF 8 and SF 2B) in the logic circuit 203 does not occur during the capture clock time. Therefore, there is no need to take into consideration the at-speed transfer on the scan chain during timing-driven layout. Accordingly, the seventh embodiment also provides an advantageous effect of shortening the period of designing the timing-driven layout.

Further, in the seventh embodiment, the delay fault test pattern generation control circuit 209 is not disposed on a clock line of an existing circuit. Therefore, the seventh embodiment also provides an advantageous effect of suppressing an increase in skew on the clock line.

(Eighth Embodiment)

Figure 15:
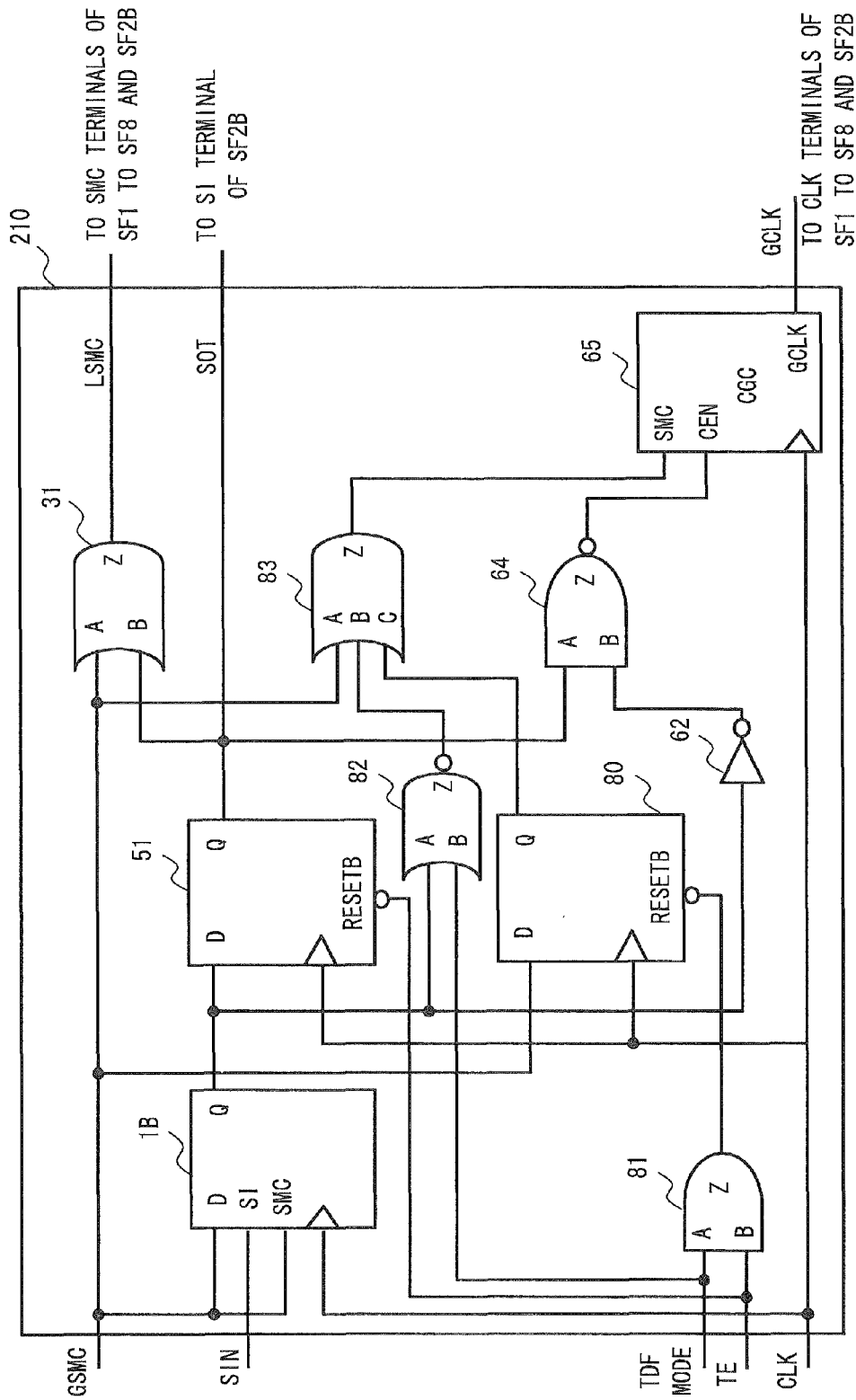
FIG. 15 is a block diagram of a delay fault test pattern generation control circuit according to an eighth embodiment.

Subsequently, configuration example of a delay fault test pattern generation control circuit 210 and the logic circuit 203 according to an eighth embodiment will be described with reference to FIG. 15.

The delay fault test pattern generation control circuit 210 has a configuration in which the clock gating cell CGC 65 is added to the delay fault test pattern generation control circuit 209. The data output terminal (Z) of the OR 83 is connected to the scan enable terminal (SMC) of the CGC 65. The data output terminal (Z) of the NAND 64 is connected to the clock enable terminal (CEN) of the CGC 65. The gated clock terminal (GCLK) of the CGC 65 is connected to the gated clock output terminal (GCLK) of the delay fault test pattern generation control circuit 210. The clock terminal of the CGC 65 is connected to the clock terminal (CLK) of the delay fault test pattern generation control circuit 210. The clock signal output from the gated clock output terminal (GCLK) of the delay fault test pattern generation control circuit 210 is supplied to the logic circuit 203. The other configuration of the delay fault test pattern generation control circuit 210 is similar to that of the delay fault test pattern generation control circuit 209, so the description thereof is omitted.

Figure 10B:
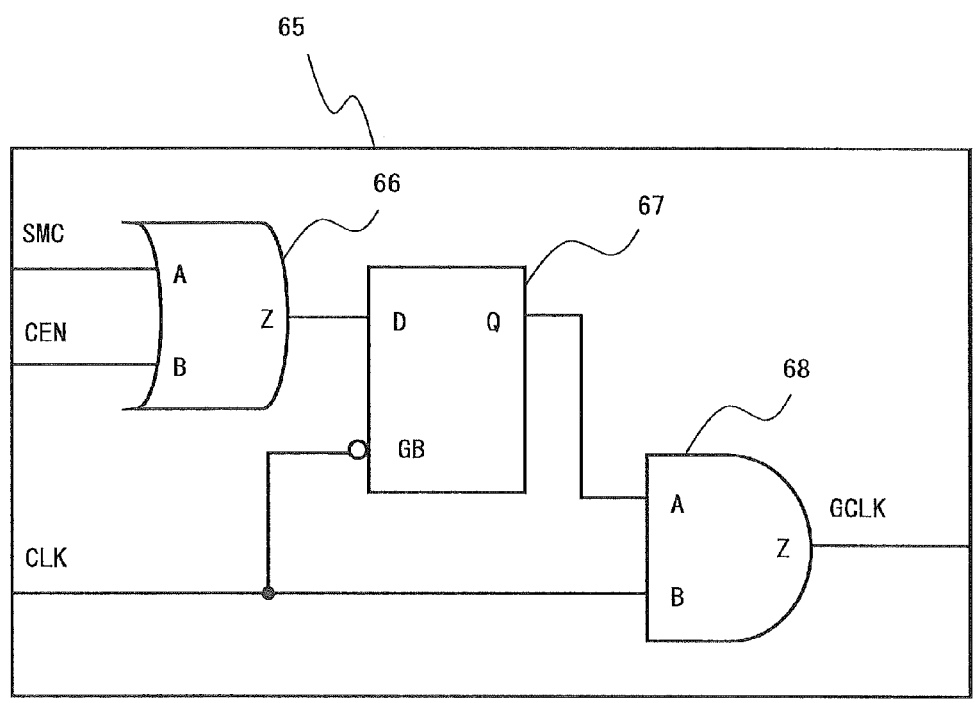
FIG. 10B is a circuit block diagram of a clock gating cell (CGC 65) according to the fifth embodiment.
Figure 10C:
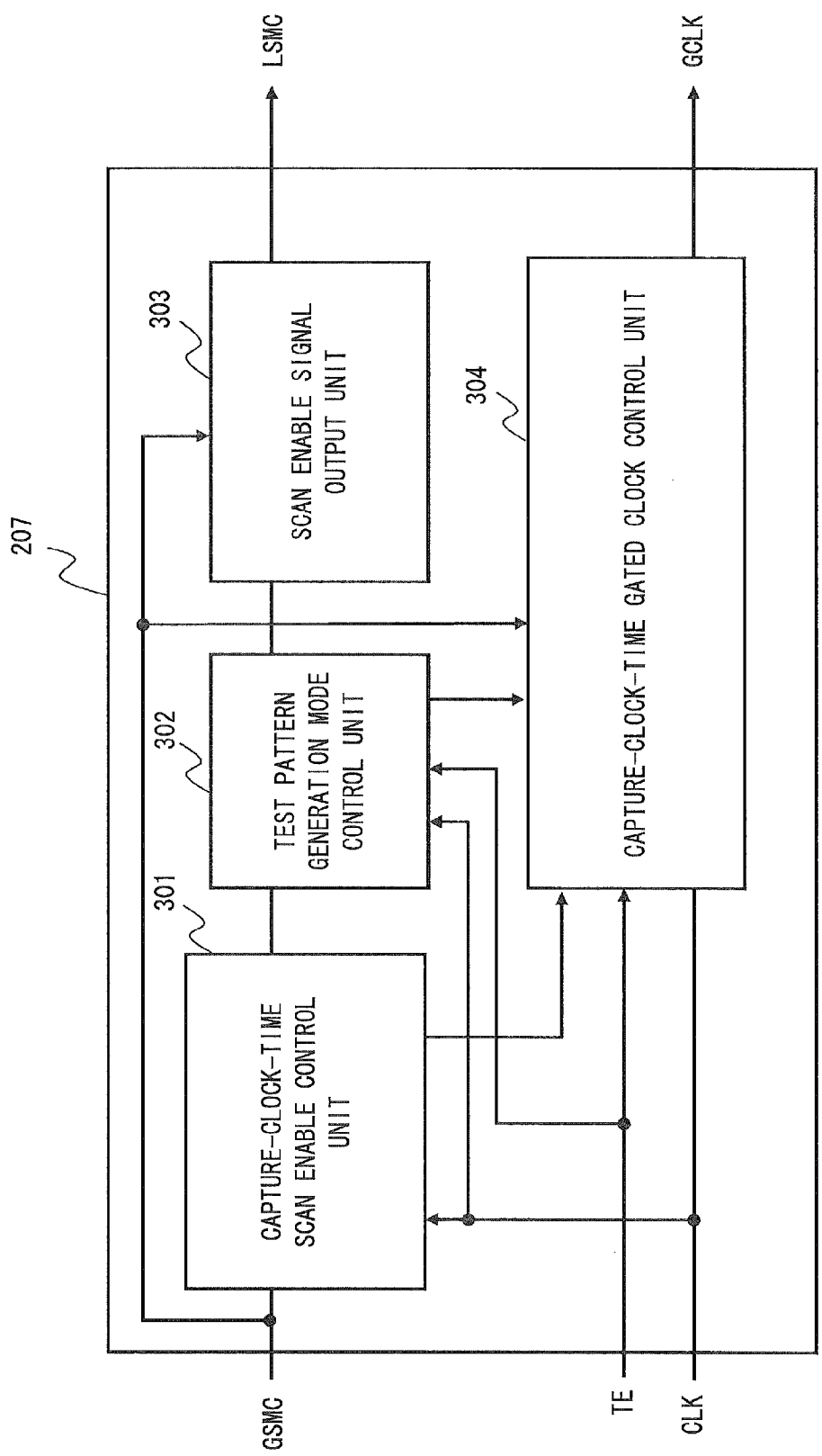
FIG. 10C is a block diagram of the delay fault test pattern generation control circuit according to the fifth embodiment.

The circuit configuration of the clock gating cell CGC 65 is similar to that shown in FIG. 10B, so the description thereof is omitted. The circuit configuration of the multiplexer-type SF 202 is similar to that shown in FIG. 1B, so the description thereof is omitted. Similarly, the circuit configuration of the logic circuit 203 is similar to that shown in FIG. 5B, so the description thereof is omitted.

The operation of the delay fault test pattern generation control circuit 210 is similar to that shown in FIG. 14, so the description thereof is omitted.

Also in the eighth embodiment, the delay fault test pattern generation control circuit 210 is converted into the number of transistors under the same conditions as those of the first embodiment. Assuming that the number of transistors of the inverter is 2 Tr; the number of transistors of each of the 2-input NAND gate and the 2-input NOR gate is 4 Tr; the number of transistors of the 3-input OR gate is 8 Tr; the number of transistors of the clock gating cell is 20 Tr; and the other conditions are the same as those of the first embodiment, the area OH of the eighth embodiment is represented by (38+30+30+2+4+4+6+6+8+20)×100=15000 Tr, and the area OH of the configuration disclosed in Japanese Unexamined Patent Application Publication No. 2008-096440 is represented by (28+6)×20000=680000 Tr. The area OH of the eighth embodiment is about 1/45 of the area OH of the configuration disclosed in Japanese Unexamined Patent Application Publication No. 2008-096440. Accordingly, the eighth embodiment provides an advantageous effect of reducing the area OH.

As in the fourth embodiment, in the delay fault test pattern generation control circuit 210, the signal value of the local scan enable terminal (LSMC) is set to "1" during capturing, thereby allowing each scan FF to stop the capture operation from the data input terminal during capturing. In a circuit including a scan compression circuit, when a scan FF irrelevant to a target fault captures a user logic, i.e., an X value from a combinational circuit such as the AND 11, the X value may be propagated to the compression circuit, which may lower the fault coverage. Suppression of the capture operation during capturing prevents each scan FF from capturing the X value and also prevents the X value from being propagated to the scan compression circuit. As a result, the delay fault test pattern generation control circuit 210 also provides an advantageous effect of improving the final delay fault coverage as compared with the delay fault test pattern generation control circuit 200.

Further, in the eighth embodiment, capturing of signals from the SI terminals of the scan FFs (SF 1 to SF 8 and SF 2B) in the logic circuit 203 does not occur during the capture clock time. Therefore, there is no need to take into consideration the at-speed transfer on the scan chain during timing-driven layout. Accordingly, the eighth embodiment also provides an advantageous effect of shortening the period of designing the timing-driven layout.

(Ninth Embodiment)

Figure 16:
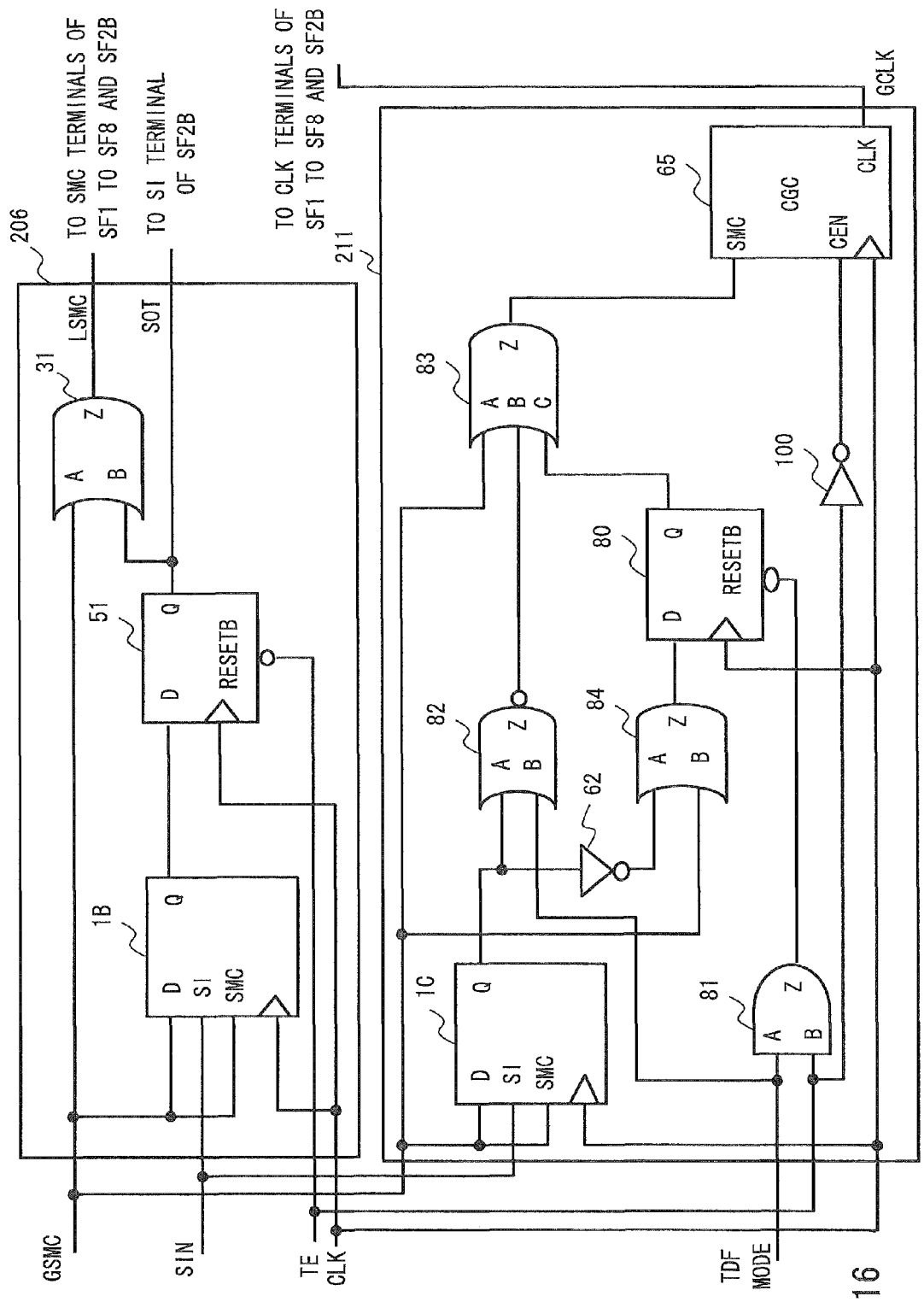
FIG. 16 is a block diagram of a delay fault test pattern generation control circuit according to a ninth embodiment.

Subsequently, a configuration example of a control circuit obtained by combining the delay fault test pattern generation control circuit 206 and a delay fault test pattern generation control circuit 211 according to a ninth embodiment will be described with reference to FIG. 16.

The delay fault test pattern generation control circuit 211 has a configuration in which the components of the delay fault test pattern generation control circuit 206 are omitted from the delay fault test pattern generation control circuit 210, thereby making the clock control system independent.

The scan input terminal of an SF 10 is connected to the same signal line SIN connected to the scan input terminal of the SF 1B of the delay fault test pattern generation control circuit 206. The GSMC is connected to each of the data input terminal (D) and the scan enable terminal (SMC) of the SF 10, the data input terminal (A) of the OR 83, and the data input terminal (B) of the OR 84. The clock signal CLK is connected to each of the clock terminal (CLK) of the SF 10, the clock terminal (CLK) of the NF 80, and the clock terminal (CLK) of the CGC 65. The scan test mode signal TE is connected to each of the data input terminal (B) of the AND 81 and the data input terminal of an inverter INV 100. The delay fault test pattern generation mode signal (TDFMODE) is connected to each of the data input terminal (A) of the AND 81 and the data input terminal (B) of the NOR 82. The data output terminal (Q) of the SF 10 is connected to each of the data input terminal (A) of the NOR 82 and the data input terminal of the INV 62. The data output terminal of the INV 62 is connected to the data input terminal (A) of the OR 84. The data output terminal (Z) of the NOR 82 is connected to the data input terminal (B) of the OR 83. The data output terminal (Z) of the OR 84 is connected to the data input terminal (D) of the NF 80. The data output terminal (Z) of the AND 81 is connected to the reset-bar terminal (RESETB) of the NF 80. The data output terminal (Z) of the NF 80 is connected to the data input terminal (C) of the OR 83. The data output terminal (Z) of the OR 83 is connected to the scan enable terminal (SMC) of the CGC 65. The data output terminal of the INV 100 is connected to the CEN terminal of the CGC 65. The gated clock terminal (GCLK) of the CGC 65 is connected to the gated clock terminal (GCLK) of the delay fault test pattern generation control circuit 211. The gated clock terminal (GCLK) of the delay fault test pattern generation control circuit 211 is connected to the clock terminal of the logic circuit 203.

The operation of the ninth embodiment is similar to that of the eighth embodiment, and the operation shown in FIG. 14 is carried out. When the signal value of the SF 1B of the delay fault test pattern generation control circuit 206 is "1" at time (T3), the delay fault test pattern generation control circuit 211 cannot output the clock from the gated clock (GCLK) at time (CCE).

Also in the ninth embodiment, the delay fault test pattern generation control circuit 211 is converted into the number of transistors under the same conditions as those of the first embodiment. Assuming that the number of transistors of the inverter is 2 Tr; the number of transistors of each of the 2-input NAND gate and the 2-input NOR gate is 4 Tr; the number of transistors of the 3-input OR gate is 8 Tr; the number of transistors of the clock gating cell is 20 Tr; and the other conditions are the same as those of the first embodiment, the area OH of the ninth embodiment is represented by (38+38+30+30+2+2+4+6+6+6+8+20)×100=19000 Tr, and the area OH of the configuration disclosed in Japanese Unexamined Patent Application Publication No. 2008-096440 is represented by (28+6)×20000=680000 Tr. Thus, the area OH of the ninth embodiment is about 1/35 of the area OH of the configuration disclosed in Japanese Unexamined Patent Application Publication No. 2008-096440. Accordingly, the ninth embodiment provides an advantageous effect of reducing the area OH.

As in the fourth embodiment, in the delay fault test pattern generation control circuits 211 and 206, the signal value of the local scan enable terminal (LSMC) is set to "1" during capturing, thereby enabling each scan FF to stop the capture operation from the data input terminal during capturing. In a circuit including a scan compression circuit, when a scan FF irrelevant to a target fault captures a user logic, i.e., an X value from a combinational circuit such as the AND 11, the X value may be propagated to the compression circuit, which may lower the fault coverage. Suppression of the capture operation during capturing prevents each scan FF from capturing the X value and also prevents the X value from being propagated to the scan compression circuit. As a result, the combination of the delay fault test pattern generation control circuits 211 and 206 also provides an advantageous effect of improving the final delay fault coverage as compared with the delay fault test pattern generation control circuit 200.

Further, in the ninth embodiment, capturing of signals from the SI terminals of the scan FFs (SF 1 to SF 8 and SF 2B) in the logic circuit 203 does not occur during the capture clock time. Therefore, there is no need to take into consideration the at-speed transfer on the scan chain during timing-driven layout. Accordingly, the ninth embodiment also provides an advantageous effect of shortening the period of designing the timing-driven layout.

(Tenth Embodiment)

Figure 17:
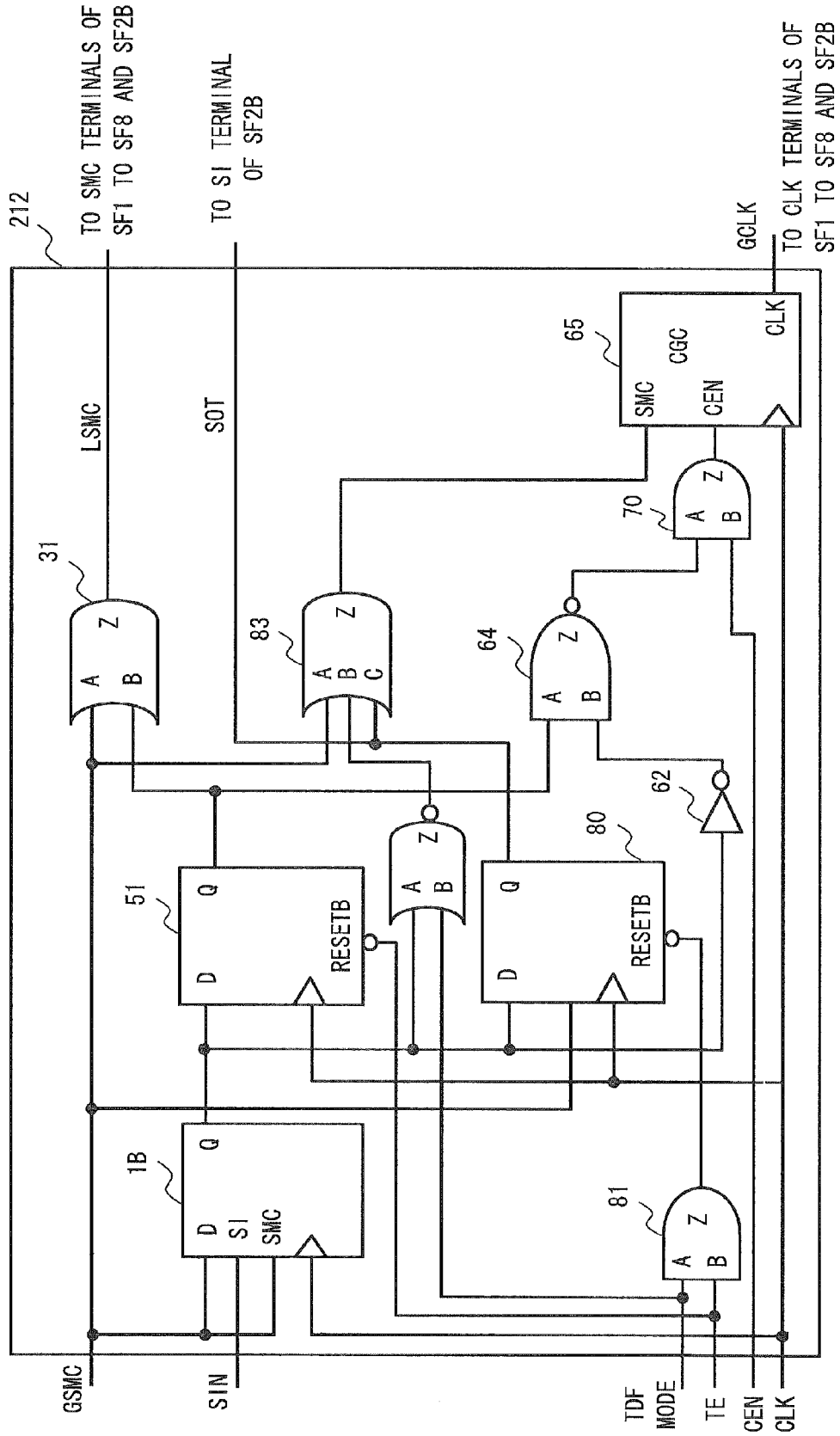
FIG. 17 is a block diagram of a delay fault test pattern generation control circuit according to a tenth embodiment.

Subsequently, a configuration example of a delay fault test pattern generation control circuit 212 according to a tenth embodiment will be described with reference to FIG. 17.

The delay fault test pattern generation control circuit 212 has a configuration in which the AND 70 is incorporated at the fan-in side of the clock enable terminal (CEN) of the CGC 65. The data input terminal (A) of the AND 70 is connected to the data output terminal (Z) of the NAND 64, and the data input terminal (B) of the AND 70 is connected to the clock enable terminal (CEN) of the delay fault test pattern generation control circuit 212. The data output terminal (Z) of the AND 70 is connected to the clock enable terminal (CEN) of the CGC 65.

In the delay fault test pattern generation control circuit 212, the clock gating cell present in the existing circuit can be replaced with the delay fault test pattern generation control circuit 212.

The operation of the delay fault test pattern generation control circuit 212 is similar to the operation of the delay fault test pattern generation control circuit 210 shown in FIG. 14, so the description thereof is omitted.

Also in the tenth embodiment, the delay fault test pattern generation control circuit 212 is converted into the number of transistors under the same conditions as those of the first embodiment. Assuming that the number of transistor of the inverter is 2 Tr; the number of transistors of each of the 2-input NAND gate and the 2-input NOR gate is 4 Tr; the number of transistors of the 3-input OR gate is 8 Tr; the number of transistors of the clock gating cell is 20 Tr; and the other conditions are the same as those of the first embodiment, the area OH of the tenth embodiment is represented by (38+30+30+2+4+4+6+6+8+20+6)×100=15600 Tr, and the area OH of the configuration disclosed in Japanese Unexamined Patent Application Publication No. 2008-096440 is represented by (28+6)×20000=680000 Tr. Thus, the area OH of the tenth embodiment is about 1/43 of the area OH of the configuration disclosed in Japanese Unexamined Patent Application Publication No. 2008-096440. Accordingly, the tenth embodiment provides an advantageous effect of reducing the area OH.

As in the fourth embodiment, in the delay fault test pattern generation control circuit 212, the signal value of the local scan enable terminal (LSMC) is set to "1" during capturing, thereby enabling each scan FF to stop the capturing operation from the data input terminal during capturing. In a circuit including a scan compression circuit, when a scan FF irrelevant to a target fault captures a user logic, i.e., an X value from a combinational circuit such as the AND 11, the X value may be propagated to the compression circuit, which may lower the fault coverage. Suppression of the capture operation during capturing prevents each scan FF from capturing the X value and also prevents the X value from being propagated to the scan compression circuit. As a result, the delay fault test pattern generation control circuit 212 also provides an advantageous effect of improving the final delay fault coverage as compared with the delay fault test pattern generation control circuit 200.

Further, in the tenth embodiment, capturing of signals from the SI terminals of the scan FFs (SF 1 to SF 8 and SF 2B) in the logic circuit 203 does not occur during the capture clock time. Therefore, there is no need to take into consideration the at-speed transfer on the scan chain during timing-driven layout. Accordingly, the tenth embodiment also provides an advantageous effect of shortening the period of designing the timing-driven layout.

Further, in the tenth embodiment, the clock gating cell of the existing circuit can be incorporated in such a mode that the clock gating cell is replaced with the delay fault test pattern generation control circuit 212. Therefore, the tenth embodiment also provides an advantageous effect of suppressing an increase in skew on the clock line.

While the present invention has been described in detail above with reference to embodiments of the invention, the SF 1 is not necessarily provided with a reset-bar terminal. Further, as easily understood by those skilled in the art, the user logic can be prevented from being destroyed also in the configuration in which an AND gate is provided at the output side of the data output terminal (Q) of the SF 1 to thereby enable control of the AND gate by using the scan test mode signal (TE). The same holds true for the SF 61, NF 51, and NF 80.

The invention made by the present inventors has been described above with reference to embodiments of the present invention. However, the present invention is not limited to the embodiments described above, but may be modified in various manners without departing from the gist of the present invention.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

The first to tenth embodiments can be combined as desirable by one of ordinary skill in the art.

What is claimed is:

1. A scan test circuit comprising:
    a plurality of flip-flop circuits forming a clock domain that operates according to a same clock within a semiconductor integrated circuit including a target of a delay fault test;
    a test pattern generation mode control unit that is supplied with the same clock as the clock supplied to the plurality of flip-flop circuits, and selects one of a skewed-load mode and a broadside mode as a test pattern generation mode of the delay fault test; and
    a scan enable signal output unit that outputs a first scan enable signal to the plurality of flip-flop circuits, the first scan enable signal being determined based on the test pattern generation mode.

2. The scan test circuit according to claim 1, wherein the scan enable signal output unit performs an OR operation using, as input values, the first scan enable signal and a second scan enable signal output from an external circuit, and outputs a result of the OR operation to the plurality of flip-flop circuits as a third scan enable signal.

3. The scan test circuit according to claim 1, further comprising a toggle value control unit that performs a scan-shift operation on a toggle value set to cause a value held in a first flip-flop circuit to transit and outputs the toggle value to the first flip-flop circuit,
    wherein when the test pattern generation mode is the skewed-load mode, the first flip-flop circuit holds the value to be output to a path serving as the target of the delay fault among the plurality of flip-flop circuits.

4. The scan test circuit according to claim 3, wherein when the test pattern generation mode is the broadside mode, the first flip-flop circuit operates to enable use of a value output from a combinational circuit as the toggle value, the combinational circuit being configured to perform an operation with a combination of values output from the plurality of flip-flop circuits.

5. The scan test circuit according to claim 1, wherein the test pattern generation mode control unit comprises a reset-function-equipped multiplexer-type scan flip-flop circuit.

6. The scan test circuit according to claim 3, wherein the toggle value control unit comprises one of a multiplexer-type scan flip-flop circuit and a D-flip-flop circuit.

7. The scan test circuit according to claim 1, further comprising a capture-clock-time scan enable control unit provided to an input unit of the test pattern generation mode control unit,
    wherein during the skewed-load mode:
        the test pattern generation mode control unit causes the first scan enable signal to transit according to a launch clock, and
        the capture-clock-time scan enable control unit operates to cause the first scan enable signal to transit according to a capture clock.

8. The scan test circuit according to claim 7, wherein:
    the test pattern generation mode control unit comprises a D-flip-flop circuit, and
    the capture-clock-time scan enable control unit comprises a multiplexer-type scan flip-flop circuit.

9. A test pattern generation control circuit comprising:
    a test pattern generation mode control unit that is supplied with a clock identical to a clock supplied to a plurality of flip-flop circuits forming a clock domain operating according to a same clock within a semiconductor integrated circuit including a path serving as a target of a delay fault test, and selects one of a skewed-load mode and a broadside mode as a test pattern generation mode of the delay fault test; and
    a scan enable signal output unit that outputs a first scan enable signal to the plurality of flip-flop circuits, the first scan enable signal being determined based on the test pattern generation mode.

10. The test pattern generation control circuit according to claim 9, wherein the scan enable signal output unit performs an OR operation using, as input values, the first scan enable signal and a second scan enable signal output from an external circuit, and outputs a result of the OR operation to the plurality of flip-flop circuits as a third scan enable signal.

11. The test pattern generation control circuit according to claim 9, further comprising a toggle value control unit that performs a scan-shift operation on a toggle value set to cause a value held in a first flip-flop circuit to transit and outputs the toggle value to the first flip-flop circuit, wherein when the test pattern generation mode is the skewed-load mode, the first flip-flop circuit holds the value to be output to the path serving as the target of the delay fault among the plurality of flip-flop circuits.

12. The test pattern generation control circuit according to claim 11, wherein when the test pattern generation mode is the broadside mode, the first flip-flop circuit operates to enable use of a value output from a combinational circuit as the toggle value, the combinational circuit being configured to perform an operation with a combination of values output from the plurality of flip-flop circuits.

13. The test pattern generation control circuit according to claim 9, wherein the test pattern generation mode control unit comprises a reset-function-equipped multiplexer-type scan flip-flop circuit.

14. The test pattern generation control circuit according to claim 11, wherein the toggle value control unit comprises one of a multiplexer-type scan flip-flop circuit and a D-flip-flop circuit.

15. The test pattern generation control circuit according to claim 9, further comprising a capture-clock-time scan enable control unit provided to an input unit of the test pattern generation mode control unit, wherein during the skewed-load mode:
the test pattern generation mode control unit causes the first scan enable signal to transit according to a launch clock, and
the capture-clock-time scan enable control unit operates to cause the first scan enable signal to transit according to a capture clock.

16. The test pattern generation control circuit according to claim 15, wherein:
the test pattern generation mode control unit comprises a D-flip-flop circuit, and
the capture-clock-time scan enable control unit comprises a multiplexer-type scan flip-flop circuit.

17. A scan test control method comprising:
supplying a clock identical to a clock supplied to a plurality of flip-flop circuits that form a clock domain operating according to a same clock within a semiconductor integrated circuit including a path serving as a target of a delay fault test, and selecting one of a skewed-load mode and a broadside mode as a test pattern generation mode of the delay fault test; and
outputting a scan enable signal to the plurality of flip-flop circuits, the scan enable signal being determined based on the test pattern generation mode.

18. The scan test circuit according to claim 7, further comprising a capture-clock-time gated clock control unit that controls the clock supplied to the plurality of flip-flop circuits,
wherein during the skewed-load mode, the capture-clock-time gated clock control unit operates to prevent the capture clock from being supplied to the plurality of flip-flop circuits when the flip-flop circuits are controlled to capture data through a scan-in terminal based on the first scan enable signal.

19. The scan test circuit according to claim 18, wherein:
the test pattern generation mode control unit comprises a D-flip-flop circuit,
the capture-clock-time scan enable control unit comprises a multiplexer-type scan flip-flop circuit, and
the capture-clock-time gated clock control unit comprises a multiplexer-type scan flip-flop circuit, a combinational circuit, and a clock gating cell.

20. The test pattern generation control circuit according to claim 15, further comprising a capture-clock-time gated clock control unit that controls the clock supplied to the plurality of flip-flop circuits,
wherein during the skewed-load mode, the capture-clock-time gated clock control unit operates to prevent the capture clock from being supplied to the plurality of flip-flop circuits when the flip-flop circuits are controlled to capture data through a scan-in terminal based on the first scan enable signal.

21. The test pattern generation control circuit according to claim 20, wherein:
the test pattern generation mode control unit comprises a D-flip-flop circuit,
the capture-clock-time scan enable control unit comprises a multiplexer-type scan flip-flop circuit, and
the capture-clock-time gated clock control unit comprises a multiplexer-type scan flip-flop circuit, a combinational circuit, and a clock gating cell.

22. The scan test circuit according to claim 18, wherein:
a clock gating cell of the capture-clock-time gated clock control unit is provided in a logic circuit unit controlled using the test pattern generation mode control unit, and
during the skewed-load mode, when the plurality of flip-flop circuits is controlled to capture data through the scan-in terminal based on the first scan enable signal, the clock gating cell operates to prevent the capture clock from being supplied to the plurality of flip-flop circuits.

23. The scan test circuit according to claim 22, wherein:
the test pattern generation mode control unit comprises a D-flip-flop circuit,
the capture-clock-time scan enable control unit comprises a multiplexer-type scan flip-flop circuit, and
the capture-clock-time gated clock control unit comprises a multiplexer-type scan flip-flop circuit and a combinational circuit.

24. The scan test circuit according to claim 22, wherein:
the capture-clock-time gated clock control unit acquires a delay fault test mode signal for switching between a delay fault test mode and a stuck-at fault test mode, and
during the skewed-load mode, when the delay fault test mode is activated, the capture-clock-time gated clock control unit operates to prevent the capture clock from being supplied to the plurality of flip-flop circuits when the flip-flop circuits are controlled to capture data through the scan-in terminal based on the first scan enable signal.

25. The scan test circuit according to claim 24, wherein:
the test pattern generation mode control unit comprises a -flip-flop circuit,
the capture-clock-time scan enable control unit comprises a multiplexer-type scan flip-flop circuit, and
the capture-clock-time gated clock control unit comprises a D-flip-flop circuit and a combinational circuit.

26. The scan test circuit according to claim 24, wherein:
a clock gating cell is provided in the capture-clock-time gated clock control unit, and
during the skewed-load mode, when the plurality of flip-flop circuits is controlled to capture data through the scan-in terminal based on the first scan enable signal, the clock gating cell operates to prevent the capture clock from being supplied to the plurality of flip-flop circuits.

27. The scan test circuit according to claim 26, wherein:
the test pattern generation mode control unit comprises a D-flip-flop circuit,
the capture-clock-time scan enable control unit comprises a multiplexer-type scan flip-flop circuit, and
the capture-clock-time gated clock control unit comprises a D-flip-flop circuit, a combinational circuit, and a clock gating cell.

28. The scan test circuit according to claim 18, further comprising:
a first delay fault test pattern generation control circuit including the test pattern generation mode control unit and the capture-clock-time scan enable control unit; and
a second delay fault test pattern generation control circuit including the capture-clock-time gated clock control unit.

29. The scan test circuit according to claim 28, wherein:
the test pattern generation mode control unit comprises a D-flip-flop circuit,
the capture-clock-time scan enable control unit comprises a multiplexer-type scan flip-flop circuit, and
the capture-clock-time gated clock control unit comprises a multiplexer-type scan flip-flop circuit, a D-flip-flop circuit, a combinational circuit, and a clock gating cell.

30. The test pattern generation control circuit according to claim 20, further comprising:
a first delay fault test pattern generation control circuit including the test pattern generation mode control unit and the capture-clock-time scan enable control unit; and
a second delay fault test pattern generation control circuit including the capture-clock-time gated clock control unit.

31. The test pattern generation control circuit according to claim 30, wherein:
the test pattern generation mode control unit comprises a D-flip-flop circuit,
the capture-clock-time scan enable control unit comprises a multiplexer-type scan flip-flop circuit, and
the capture-clock-time gated clock control unit comprises a multiplexer-type scan flip-flop circuit, a D-flip-flop circuit, a combinational circuit, and a clock gating cell.

32. The scan test circuit according to claim 24, wherein the clock gating cell of the capture-clock-time gated clock control unit is caused to operate based on an externally supplied clock enable signal.

33. The scan test circuit according to claim 32, wherein:
the test pattern generation mode control unit comprises a D-flip-flop circuit,
the capture-clock-time scan enable control unit comprises a multiplexer-type scan flip-flop circuit, and
the capture-clock-time gated clock control unit comprises a multiplexer-type scan flip-flop circuit, a combinational circuit, and a clock gating cell.

34. A scan test control method comprising:
supplying a clock identical to a clock supplied to a plurality of flip-flop circuits that form a clock domain operating according to a same clock within a semiconductor integrated circuit including a path serving as a target of a delay fault test, and selecting one of a skewed-load mode and a broadside mode as a test pattern generation mode of the delay fault test; and
outputting a scan enable signal to the plurality of flip-flop circuits to stop a supply of an unwanted capture clock signal to the plurality of flip-flop circuits, the scan enable signal being determined based on the test pattern generation mode.

* * * * *